United States Patent
Lee et al.

(10) Patent No.: US 12,266,748 B2
(45) Date of Patent: Apr. 1, 2025

(54) DISPLAY DEVICE

(71) Applicant: Samsung Display Co., LTD., Yongin-si (KR)

(72) Inventors: Su Jin Lee, Yongin-si (KR); Jae Yong Jang, Yongin-si (KR); Jin Woo Choi, Yongin-si (KR); Bon Yong Koo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 382 days.

(21) Appl. No.: 17/563,478

(22) Filed: Dec. 28, 2021

(65) Prior Publication Data
US 2022/0352443 A1 Nov. 3, 2022

(30) Foreign Application Priority Data
Apr. 30, 2021 (KR) .................. 10-2021-0056845

(51) Int. Cl.
*H01L 33/62* (2010.01)
*H01L 27/15* (2006.01)

(52) U.S. Cl.
CPC ............ *H01L 33/62* (2013.01); *H01L 27/156* (2013.01)

(58) Field of Classification Search
CPC ..................... H01L 25/167; H01L 25/0753
See application file for complete search history.

(56) References Cited

U.S. PATENT DOCUMENTS

| | | | |
|---|---|---|---|
| 7,964,884 B2 | 6/2011 | Lee | |
| 9,412,803 B2 | 8/2016 | Park | |
| 9,939,693 B2 | 4/2018 | Kwon et al. | |
| 11,094,741 B2 | 8/2021 | Kim et al. | |
| 11,710,760 B2 | 7/2023 | Kusunoki et al. | |
| 12,010,906 B2 | 6/2024 | Hong et al. | |
| 2020/0403028 A1* | 12/2020 | Kusunoki | ......... H01L 29/66969 |

FOREIGN PATENT DOCUMENTS

| | | |
|---|---|---|
| KR | 10-1239852 | 3/2013 |
| KR | 10-2015-0134953 | 12/2015 |
| KR | 10-2016-0087978 | 7/2016 |
| KR | 10-2017-0077914 | 7/2017 |
| KR | 10-1920770 | 11/2018 |
| KR | 10-2020-0046224 | 5/2020 |
| KR | 10-2020-0145729 | 12/2020 |
| KR | 10-2020-0145900 | 12/2020 |

* cited by examiner

*Primary Examiner* — Matthew L Reames
(74) *Attorney, Agent, or Firm* — KILE PARK REED & HOUTTEMAN PLLC

(57) ABSTRACT

A display device includes a substrate including a display area and a non-display area, a pixel circuit portion disposed on the substrate and including a transistor that drives a pixel, and a display element portion disposed on the pixel circuit portion and including a pixel electrode electrically connected to an electrode of the transistor through a bridge pattern. The pixel circuit portion includes a first capping layer disposed between the bridge pattern and the pixel electrode, and the pixel electrode and the bridge pattern are multiple metal layers including a same material.

22 Claims, 17 Drawing Sheets

DISPLAY DEVICE

CROSS-REFERENCE TO RELATED APPLICATION(S)

This application claims priority to and benefits of Korean Patent Application No. 10-2021-0056845 under 35 U.S.C. § 119, filed Apr. 30, 2021, in the Korean Intellectual Property Office (KIPO), the entire contents of which are incorporated herein by reference.

BACKGROUND

1. Technical Field

The disclosure relates to a display device.

2. Description of the Related Art

In recent years, as interest in information display is increasing, research and development for a display device are continuously being conducted.

SUMMARY

An object to be solved by the disclosure is to provide a display device capable of preventing damage to a lower metal layer, by protecting the lower metal layer disposed on a layer lower than that of a pixel electrode and exposed to an outside, in an etching process of the pixel electrode.

Objects of the disclosure are not limited to the above-described object, and other technical objects which are not described will be clearly understood by those skilled in the art from the following description.

A display device according to an embodiment of the disclosure may include a substrate including a display area and a non-display area, a pixel circuit portion disposed on the substrate and including a transistor that drives a pixel, and a display element portion disposed on the pixel circuit portion and including a pixel electrode electrically connected to an electrode of the transistor through a bridge pattern.

The pixel circuit portion may include a first capping layer disposed between the bridge pattern and the pixel electrode, and the pixel electrode and the bridge pattern are multiple metal layers including a same material.

The pixel electrode may be a double metal layer including copper and titanium, and the bridge pattern may be a triple metal layer structure of titanium/aluminum/titanium.

The first capping layer may include a transparent conductive material.

The first capping layer may be disposed on a surface of the bridge pattern exposed by a first contact hole formed in an organic layer disposed between the bridge pattern and the pixel electrode, and a surface of the organic layer.

The first capping layer may be disposed on an entire upper surface of the bridge pattern facing the pixel electrode.

The pixel may include a light emitting element having a nano scale to a micro scale.

The display device may further include a light control portion disposed on the display element portion and changing a wavelength of light provided from the light emitting element.

The light emitting element may include one end electrically connected to a first power voltage line through the pixel electrode and another end electrically connected to a second power voltage line through a common electrode.

The pixel circuit portion may include the second power voltage line in the non-display area, and the second power voltage line may be electrically connected to the common electrode through a connection pattern.

The pixel circuit portion may include a second capping layer disposed between the connection pattern and the common electrode.

The second capping layer may be disposed on a surface of the connection pattern exposed by a second contact hole formed in the organic layer disposed between the connection pattern and the common electrode, and a surface of the organic layer.

The connection pattern may include through holes, and the through holes may not overlap the second contact holes in a plan view.

The second capping layer may be disposed on an entire upper surface of the connection pattern facing the common electrode.

The second capping layer may include a transparent conductive material, and the connection pattern may be a triple metal layer structure of titanium/aluminum/titanium.

The pixel circuit portion may include a pad area including pads are disposed in the non-display area.

Each of the pads may overlap in a thickness direction and may include different metal layers electrically connected, and an upper metal layer among the metal layers may be a triple metal layer structure of titanium/aluminum/titanium.

Each of the pads may correspond to a surface of the upper metal layer exposed by a first opening formed in the organic layer.

The display device may further include a third capping layer disposed on a surface of the upper metal layer exposed by the first opening and a surface of the organic layer.

The third capping layer may include a transparent conductive material.

The first power voltage line may be electrically connected to a fan-out line electrically connected to each of the pads through a connection line.

The display device may further include a fourth capping layer disposed on a surface of the connection line exposed by a second opening formed in the organic layer and a surface of the organic layer.

The fourth capping layer may include a transparent conductive material.

A solution means of the object of the disclosure is not limited to the above-described solution means, and solution means which are not described will be clearly understood by those skilled in the art from the present specification and the accompanying drawings.

According to the display device according to an embodiment of the disclosure, a lower metal layer may be prevented from being damaged, by disposing a capping layer on the lower metal layer disposed on a layer lower than that of a pixel electrode and exposed to the outside, in an etching process of the pixel electrode.

An effect of the disclosure is not limited to the above-described effects, and effects which are not described will be clearly understood by those skilled in the art from the present specification and the accompanying drawings.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
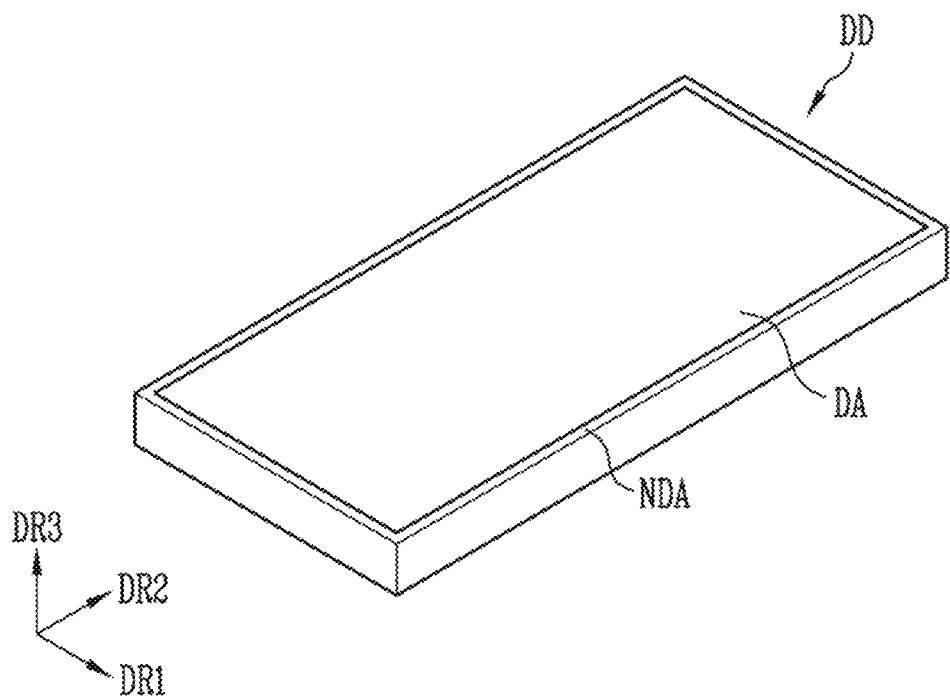
FIG. 1 is a perspective view schematically illustrating a display device according to an embodiment.

Since the embodiment described in the specification is for clearly describing the spirit of the disclosure to those skilled in the art to which the disclosure pertains, the disclosure is not limited by the embodiment described in the specification, and the scope of the disclosure should be interpreted as including modifications or variations that do not depart from the spirit of the disclosure.

The term used in the specification is selected as a general term that is currently widely used in consideration of a function of the disclosure, the term may vary according to the intention of those skilled in the art to which the disclosure pertains, customs, the appearance of new technologies, or the like. However, unlike this, when a specific term is defined as an arbitrary meaning and used, the meaning of the term will be described separately. Therefore, the term used in the specification should be interpreted based on the actual meaning of the term and contents throughout the specification, other than a name of a simple term.

The drawings attached to the specification are intended to easily describe the disclosure. Since the shape shown in the drawings may be exaggerated and displayed as necessary to help understanding of the disclosure, the disclosure is not limited by the drawings.

In the specification, when it is determined that detailed description of a known configuration or function related to the disclosure may obscure the subject matter of the disclosure, detailed description thereof will be omitted as necessary.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
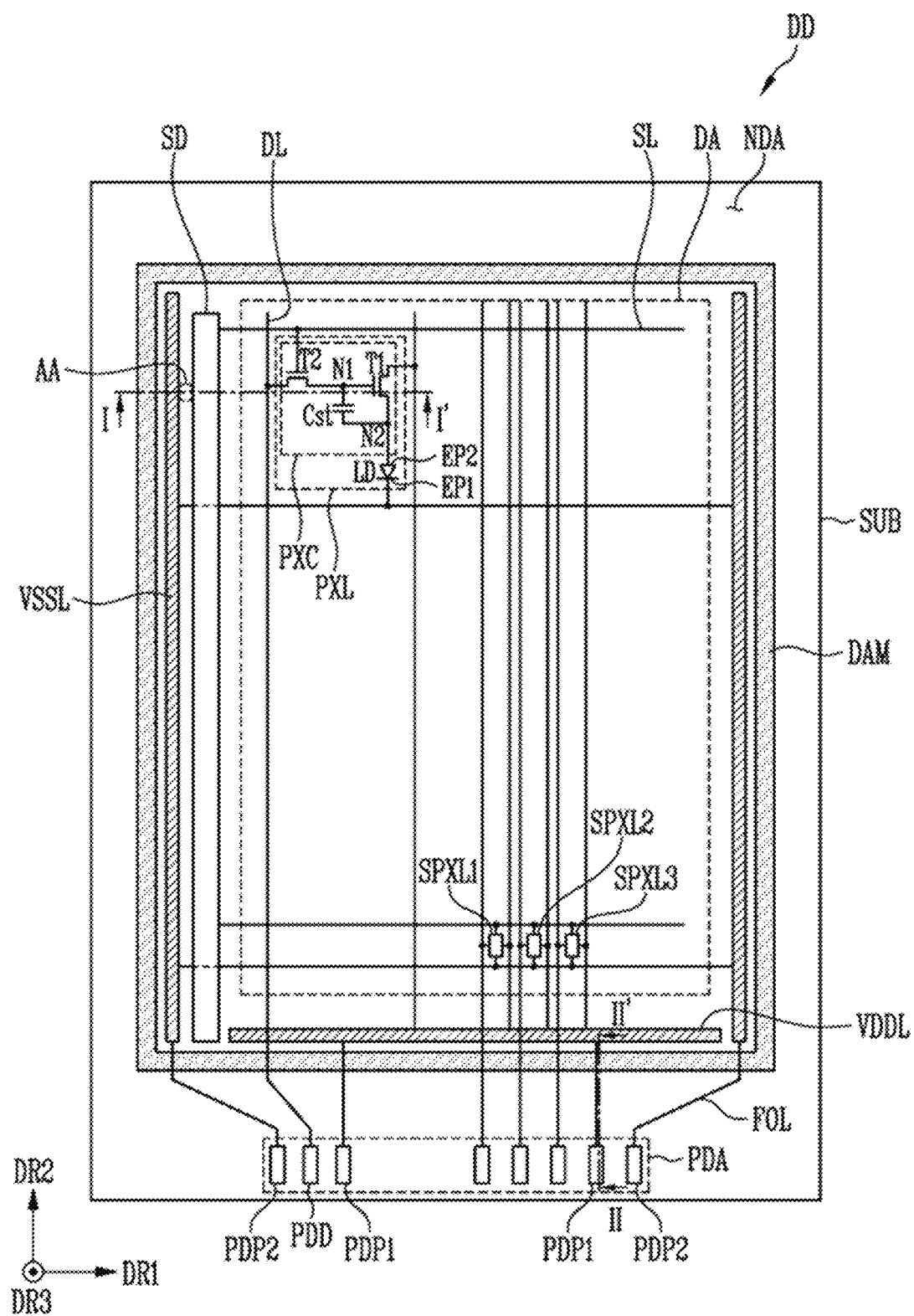
FIG. 2 is a plan view schematically illustrating a display device according to an embodiment.

FIG. 1 is a perspective view schematically illustrating a display device according to an embodiment. FIG. 2 is a plan view schematically illustrating a display device according to an embodiment.

Referring to FIGS. 1 and 2, a display device DD according to an embodiment may include a substrate SUB and a pixel PXL disposed on the substrate SUB. The substrate SUB may form (or configure) a base member of the display device DD. The substrate SUB may be a rigid or flexible substrate or film, but the disclosure is not limited to a specific example.

The display device DD may include a display area DA and a non-display area NDA in a plan view. In the embodiment, the non-display area NDA may be defined along an edge of the display area DA. The display area DA may refer to an area in which the pixel PXL is disposed. The non-display area NDA may refer to an area in which the pixel PXL is not disposed.

In the non-display area NDA, a driving circuit, lines, and pads PDP1, PDP2, and PDD electrically connected to the pixel PXL of the display area DA may be disposed. For example, the driving circuit for driving the pixel PXL may include a scan driver SD, and the lines for driving the pixel PXL may include scan lines SL, data lines DL, a first power voltage line VDDL, a second power voltage line VSSL, and the like.

Pixels PXL may be disposed in the display area DA. Each of the pixels PXL may include a light emitting element LD and a pixel driving circuit PXC electrically connected thereto.

The scan driver SD may generate scan signals and sequentially output the scan signals to the scan lines SL. The scan driver SD may further output another control signal to the driving circuit PXC of the pixels PXL.

The scan driver SD and the driving circuit PXC of the pixels PXL may include thin-film transistors formed by a same process, for example, a low temperature polycrystalline silicon (LTPS) process or a low temperature polycrystalline oxide (LTPO) process.

The data lines DL may be electrically connected to a driver IC (integrated circuit) (not shown) by a data pad PDD and a fan-out line FOL. The data lines DL may receive a data signal from the driver IC (not shown) through the fan-out lines FOL.

The scan lines SL may be electrically connected to corresponding pixels PXL, respectively, among the pixels PXL, and the data lines DL may be electrically connected to corresponding pixels PXL, respectively, among the pixels PXL. The first and second power lines VDDL and VSSL may be electrically connected to the pixels PXL.

The display device DD may include the pads PDD, PDP1, and PDP2 electrically connected to ends of the data lines DL and the first and second power lines VDDL and VSSL. The pads PDD, PDP1, and PDP2 may be a type of circuit element. An area in which the pads PDD, PDP1, and PDP2 are disposed in the non-display area may be defined as a pad area PDA. In the pad area PDA according to an embodiment, the first power pad PDP1 electrically connected to the first power voltage line VDDL, the second power pad PDP2 electrically connected to the second power voltage line VSSL, and the data pad PDD electrically connected to the data line DL may be disposed in a first direction DR1, through the respective fan-out lines FOL.

The first power voltage line VDDL may supply a first power voltage to the pixel PXL, and the second power voltage line VSSL may supply a second power voltage to the pixel PXL. For example, the first power voltage VDD may be a high DC power voltage applied to the light emitting element LD, and the second power voltage may be a low DC power voltage applied to the light emitting element LD.

The first power voltage line VDDL may have a linear shape corresponding to a lower edge of the display area DA. For example, the first power voltage line VDDL may generally extend in the first direction DR1 may be branched in a second direction DR2 in a region, and may be electrically connected to the first power pads PDP1.

The second power voltage line VSSL may be formed on both sides of the display area DA. The second power voltage line VSSL may extend in an area (for example, a lower side of the display area DA) and may be electrically connected to the second power pads PDP2. FIG. 2 illustrates that the second power voltage line VSSL is disposed only on the both sides of the display area DA, but the disclosure is not limited thereto. For example, the second power voltage line VSSL may be disposed to surround both sides and an upper side except for the lower side of the display area DA.

A total maximum current capacity for driving the light emitting elements LD included in the pixels PXL may be a level of tens of amperes, and the current capacity for a power voltage may increase as the display device DD becomes larger. Accordingly, widths of the first power voltage line VDDL and the second power voltage line VSSL may increase.

According to an embodiment, the pixel PXL may include a first sub pixel SPXL1, a second sub pixel SPXL2, and a third sub pixel SPXL3.

According to an example, the pixel PXL may be arranged according to a stripe or a PENTILE™ arrangement structure, but the disclosure is not limited thereto, and various embodiments may be applied.

According to an embodiment, the pixel PXL including the first to third sub pixels SPXL1, SPXL2, and SPXL3 may be disposed in the display area DA. For example, in the display area DA, a first sub pixel SPXL1 emitting light of a first color, a second sub pixel SPXL2 emitting light of a second color, and a third sub pixel SPXL3 emitting light of a third color may be arranged, and at least one of the first to third sub pixels SPXL1, SPXL2, and SPXL3 may configure a pixel unit (or pixel part) capable of emitting light of various colors.

For example, each of the first to third sub pixels SPXL1, SPXL2, and SPXL3 may be a sub pixel emitting light of a predetermined color. In an embodiment, the first sub pixel SPXL1 may be a red pixel emitting light of red (in an embodiment, a first color), the second sub pixel SPXL2 may be a green pixel emitting light of green (in an embodiment, a second color), and the third sub pixel SPXL3 may be a blue pixel emitting light of blue (in an embodiment, a third color). However, the color, type, number, and/or the like of the pixels PXL configuring each pixel unit are/is not limited to a specific example.

The pixel PXL may include the light emitting element LD and the pixel circuit PXC.

The light emitting element LD may be electrically connected between the first power voltage line VDDL and the second power voltage line VSSL. A second end portion EP2 (in an embodiment, a P-type semiconductor) of the light emitting element LD may be electrically connected to the first power voltage line VDDL through a pixel electrode PE (refer to FIG. 4) and the pixel circuit PXC, and a first end portion EP1 (in an embodiment, an N-type semiconductor) of the light emitting element LD may be electrically connected to the second power voltage line VSSL by a common electrode CE (refer to FIG. 4).

According to an embodiment, in case that a driving current is supplied through the pixel circuit PXC, the light emitting element LD may emit light at a luminance corresponding to the driving current.

According to an embodiment, the light emitting elements LD may be electrically connected to each other in various connection structures between the first power voltage line VDDL and the second power voltage line VSSL. In an embodiment, the light emitting elements LD may be electrically connected to each other only in parallel or in series. As another example, the light emitting elements LD may be electrically connected in a serial-parallel mixed structure.

The first power voltage line VDDL and the second power voltage line VSSL may have different potentials so that the light emitting elements LD may emit light. The first power voltage line VDDL and the second power voltage line VSSL may have a potential difference of a level at which light may be emitted during an emission period of the pixel PXL. For example, the first power voltage line VDDL may be set to a potential higher than that of the second power voltage line VSSL.

The pixel circuit PXC may electrically connect the first power voltage line VDDL and the light emitting element LD. The pixel circuit PXC may include a first transistor T1, a second transistor T2, and a storage capacitor Cst.

According to an embodiment, an electrode of the first transistor T1 may be electrically connected to the first power voltage line VDDL, and another electrode may be electrically connected to an electrode (in an embodiment, an anode electrode) of the light emitting element LD. A gate electrode of the first transistor T1 may be electrically connected to a first node N1. The first transistor T1 may control a current flowing through the light emitting element LD in response to a voltage applied through the first node N1.

According to an embodiment, an electrode of the second transistor T2 may be electrically connected to a data line DL, and another electrode thereof may be electrically connected to the first node N1. A gate electrode of the second transistor T2 may be electrically connected to a scan line SL. In case that a scan signal is supplied from the scan line SL, the second transistor T2 may be turned on to transmit the data signal, provided from the data line DL, to the first node N1.

The storage capacitor Cst may be electrically connected between the first node N1 (or the gate electrode of the first transistor T1) and a second node N2 (or another electrode of the first transistor T1). The storage capacitor Cst may store information on a difference between a voltage of the first node N1 and a voltage of the second node N2.

A structure of the pixel circuit PXC is not limited to the structure shown in FIG. 2, and various types of structures may be implemented. FIG. 2 illustrates that the first and second transistors T1 and T2 are N-type transistors, but the disclosure is not limited thereto. In some embodiments, the first and second transistors T1 and T2 may be configured of P-type transistors.

The display device DD may include a dam portion DAM. The dam portion DAM may extend along an edge of the display area DA. For example, the dam portion DAM may surround the display area DA.

Figure 3:
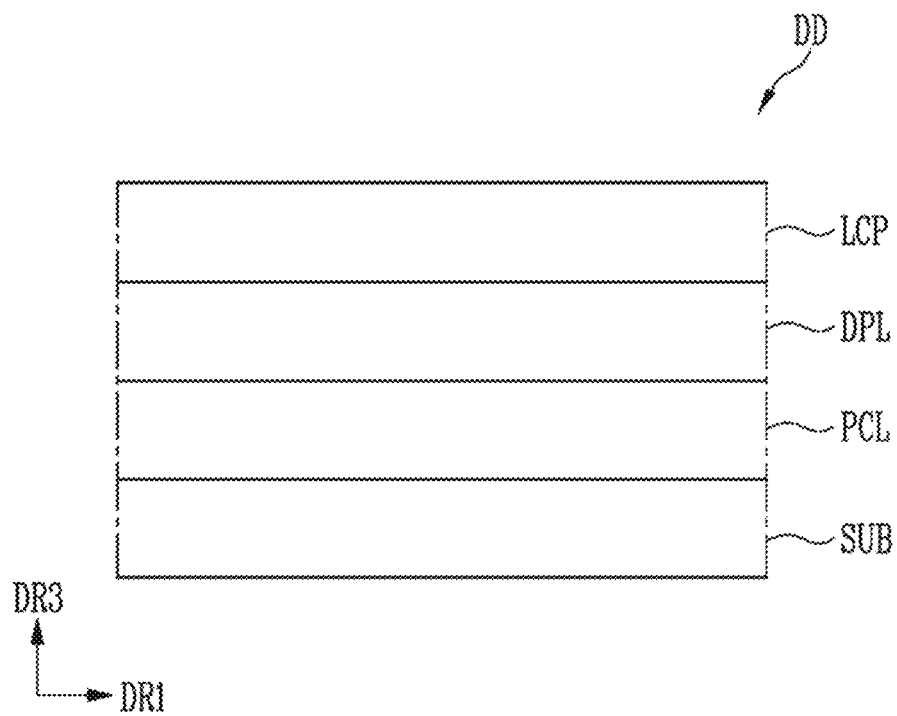
FIG. 3 is a cross-sectional view illustrating a display device according to an embodiment.

FIG. 3 is a schematic cross-sectional view illustrating a display device according to an embodiment.

The display device DD may include the substrate SUB, a pixel circuit portion PCL, a display element portion DPL, and a light control portion LCP. According to an embodiment, the substrate SUB, the pixel circuit portion PCL, the display element portion DPL, and the light control portion LCP may be sequentially stacked according to a display direction (for example, a third direction DR3) of the display device DD. The display direction may mean a thickness direction of the substrate SUB.

The substrate SUB may form a base surface of the display device DD. An individual configuration of the display device DD may be disposed on the substrate SUB.

The pixel circuit portion PCL may be disposed on the substrate SUB. The pixel circuit portion PCL may include a pixel circuit PXC (refer to FIG. 2) configured to drive the pixel PXL.

The display element portion DPL may be disposed on the pixel circuit portion PCL. The display element portion DPL may emit light based on an electrical signal provided from the pixel circuit portion PCL. The display element portion DPL may include a light emitting element LD (refer to FIG. 2) capable of emitting light. The light emitted from the display element portion DPL may pass through the light control portion LCP and may be provided to an outside.

The light control portion LCP may be disposed on the display element portion DPL. The light control portion LCP may be disposed on the light emitting elements LD (refer to FIG. 2). The light control portion LCP may change a wavelength of the light provided from the display element portion DPL (or the light emitting elements LD). According to an embodiment, as shown in FIG. 4, the light control portion LCP may include a color conversion portion CCL configured to change the wavelength of the light and a color filter portion CFL that transmits light of a specific wavelength.

Figure 4:
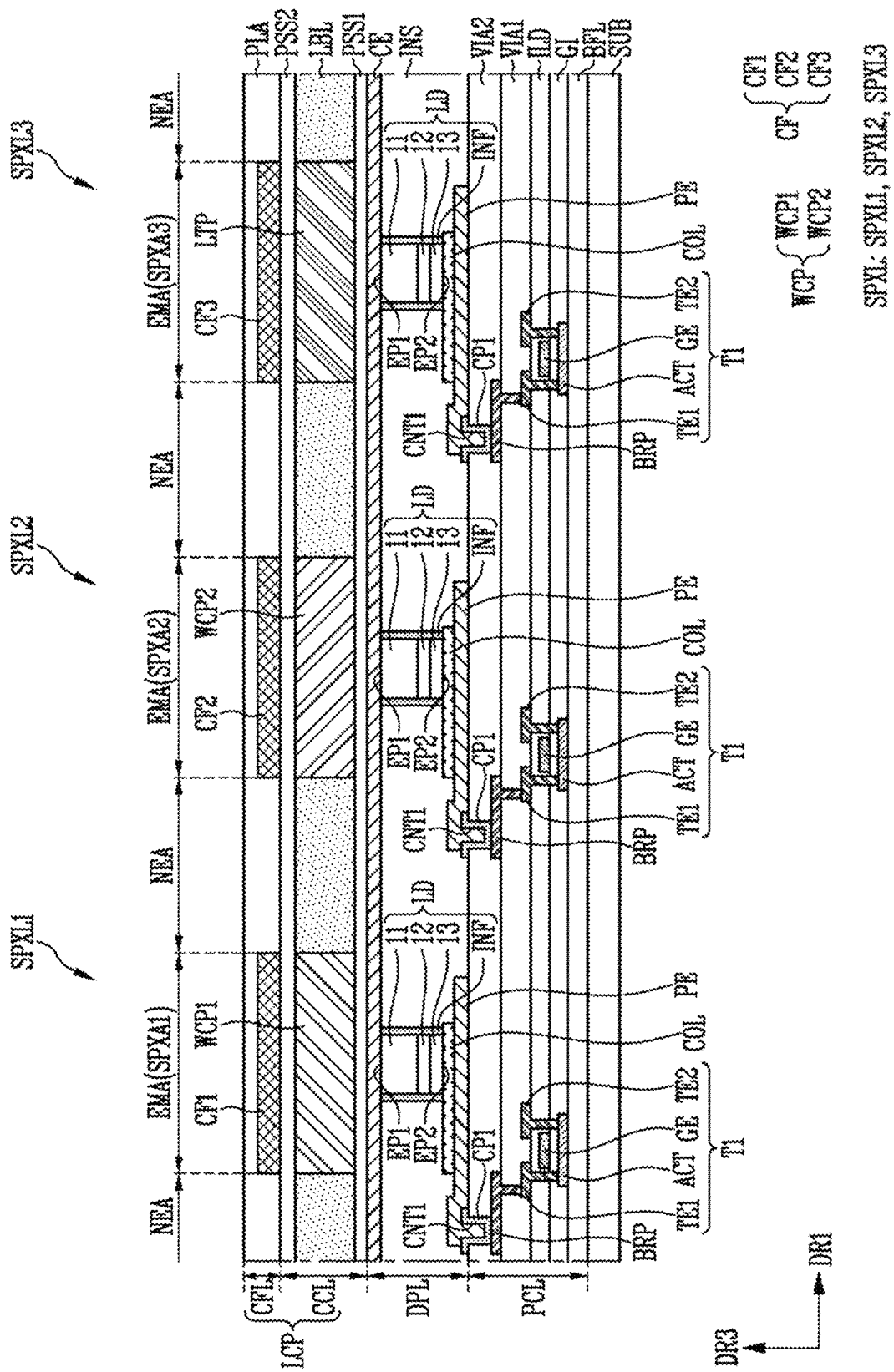
FIG. 4 is a cross-sectional view schematically illustrating a pixel according to an embodiment.
Figure 5:
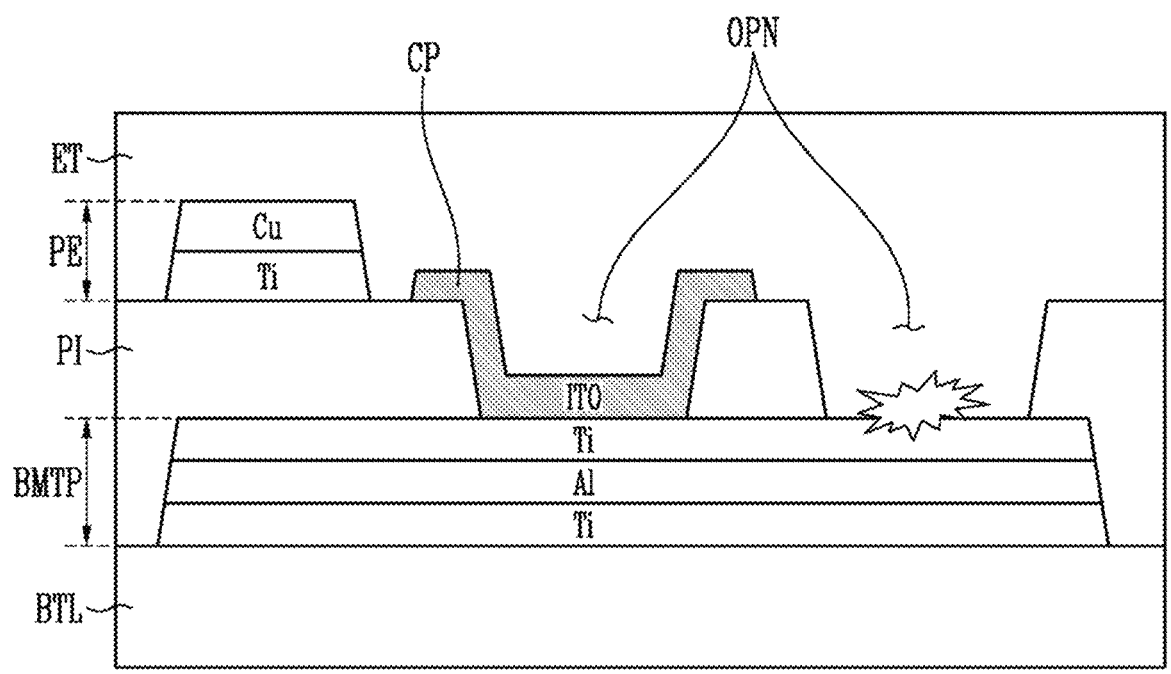
FIGS. 5 and 6 are diagrams illustrating a method for protecting a lower metal layer exposed to an etchant during a process of etching a pixel electrode.
Figure 6:
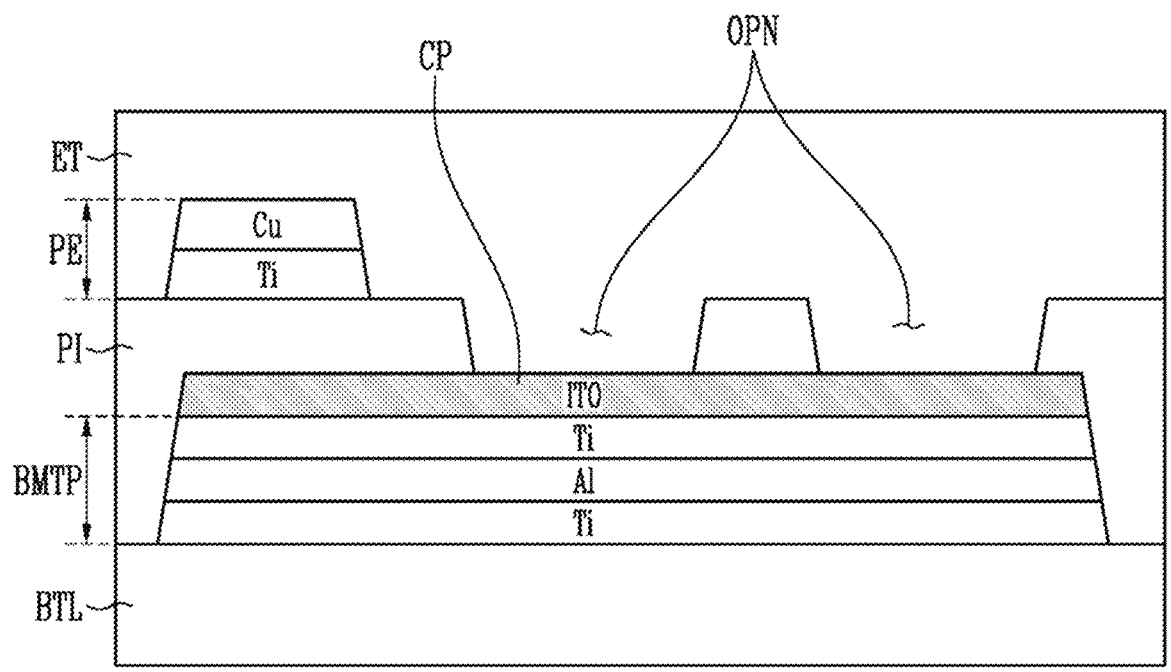

FIG. 4 is a cross-sectional view schematically illustrating a pixel according to an embodiment. FIGS. 5 and 6 are schematic diagrams illustrating a method for protecting a lower metal layer exposed to an etchant during a process of etching a pixel electrode.

FIG. 4 illustrates the first sub pixel SPXL1, the second sub pixel SPXL2, and the third sub pixel SPXL3.

As illustrated in FIG. 4, the description is given based on the first transistor T1 among the configurations included in the pixel circuit PXC described with reference to FIG. 2. As an embodiment, an embodiment in which the first transistor T1 is provided in each of the first sub pixel SPXL1, the second sub pixel SPXL2, and the third sub pixel SPXL3 is shown.

The pixel circuit portion PCL may be disposed on the substrate SUB. The pixel circuit portion PCL may include a buffer layer BFL, the first transistor T1, a gate insulating layer GI, an interlayer insulating layer ILD, a first organic layer VIA1, a bridge pattern BRP, a first capping layer CP1, a first contact hole CNT1, and a second organic layer VIA2.

According to an embodiment, individual components of the pixel circuit portion PCL may be defined in each of the first to third sub pixels SPXL1, SPXL2, and SPXL3.

The buffer layer BFL may be disposed on the substrate SUB. The buffer layer BFL may prevent an impurity from being diffused from an outside. The buffer layer BFL may include at least one of metal oxides such as silicon nitride ($SiN_x$), silicon oxide ($SiO_x$), silicon oxynitride ($SiO_xN_y$), and aluminum oxide ($AlO_x$).

According to an embodiment, the first transistor T1 may be a thin-film transistor. According to an embodiment, the first transistor T1 may be a driving transistor.

The first transistor T1 may be electrically connected to the light emitting element LD. In an embodiment, the first transistor T1 of the first sub pixel SPXL1 may be electrically connected to the light emitting element LD disposed in a first sub pixel area SPXA1. The first transistor T1 of the second sub pixel SPXL2 may be electrically connected to the light emitting element LD disposed in a second sub pixel area PXA2. The first transistor T1 of the third sub pixel SPXL3 may be electrically connected to the light emitting element LD disposed in a third sub pixel area PXA3.

According to an embodiment, the first transistor T1 may include an active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include at least one of polysilicon, amorphous silicon, and oxide semiconductor.

According to an embodiment, the active layer ACT may include a first contact region that is in contact with the first transistor electrode TE1 and a second contact region that is in contact with the second transistor electrode TE2. The first contact region and the second contact region may be a semiconductor pattern doped with an impurity. A region between the first contact region and the second contact region may be a channel region. The channel region may be an intrinsic semiconductor pattern that is not doped with an impurity.

The gate electrode GE may be disposed on the gate insulating layer GI. A position of the gate electrode GE may correspond to a position of the channel region of the active layer ACT. For example, the gate electrode GE may be disposed on the channel region of the active layer ACT with the gate insulating layer GI interposed therebetween.

The gate insulating layer GI may be disposed on the active layer ACT. The gate insulating layer GI may include an inorganic material. According to an embodiment, the gate insulating layer GI may include at least one of silicon nitride ($SiN_x$), silicon oxide ($SiO_x$), silicon oxynitride ($SiO_xN_y$), and aluminum oxide ($AlO_x$). According to an embodiment, the gate insulating layer GI may include an organic material.

The interlayer insulating layer ILD may be positioned on the gate electrode GE. Similar to the gate insulating layer GI, the interlayer insulating layer ILD may include at least one of silicon nitride ($SiN_x$), silicon oxide ($SiO_x$), silicon oxynitride ($SiO_xN_y$), and aluminum oxide ($AlO_x$).

The first transistor electrode TE1 and the second transistor electrode TE2 may be positioned on the interlayer insulating layer ILD. The first transistor electrode TE1 may pass through the gate insulating layer GI and the interlayer insulating layer ILD and may contact the first contact region of the active layer ACT, and the second transistor electrode TE2 may pass through the gate insulating layer GI and the interlayer insulating layer ILD and may contact the second contact region of the active layer ACT. According to an embodiment, the first transistor electrode TE1 may be a source electrode, and the second transistor electrode TE2 may be a drain electrode, but the disclosure is not limited thereto.

The first organic layer VIA1 may be positioned on the first transistor electrode TE1 and the second transistor electrode TE2. The first organic layer VIA1 may be formed of a single layer or multiple layers formed of an organic material or an inorganic material. The first organic layer VIA1 may include a general-purpose polymer such as benzocyclobutene (BCB), polyimide, hexamethyldisiloxane (HMDSO), poly (methyl methacrylate) (PMMA), or polystyrene (PS), a polymer derivative having a phenolic group, acrylic polymer, imide polymer, arylether polymer, amide polymer, fluorine polymer, p-xylene polymer, vinyl alcohol polymer, a blend thereof, and the like. The first organic layer VIA1 may include an inorganic material. The inorganic material may include at least one of silicon nitride ($SiN_x$), silicon oxide ($SiO_x$), silicon oxynitride ($SiO_xN_y$), and aluminum oxide ($AlO_x$).

The bridge pattern BRP may be disposed on the first organic layer VIA1. The bridge pattern BRP may be electrically connected to the first transistor electrode TE1 through a contact hole passing through the first organic layer VIA1. The bridge pattern BRP may include metal. The bridge pattern BRP may be multiple layers. For example, the bridge pattern BRP may be a triple metal layer structure of titanium/aluminum/titanium (Ti/Al/Ti).

The second organic layer VIA2 may be positioned on the first organic layer VIA1. The second organic layer VIA2 may cover (or overlap) the bridge pattern BRP. The second organic layer VIA2 may be formed of a single layer or multiple layers formed of an organic material or an inorganic material. The second organic layer VIA2 may include at least one of the materials that may form the first organic layer VIA1. According to an embodiment, the first contact hole CNT1 for electrically connecting a region of the bridge pattern BRP and the pixel electrode PE may be formed in the second organic layer VIA2.

The pixel circuit portion PCL may include a first capping layer CP1 interposed between the bridge pattern BRP and the pixel electrode PE. The first capping layer CP1 may be disposed on the second organic layer VIA2 and the bridge pattern BRP exposed by the first contact hole CNT1.

The first capping layer CP1 may include a transparent conductive material. For example, the first capping layer CP1 may include any of conductive oxides such as indium tin oxide (ITO), indium zinc oxide (IZO), zinc oxide (ZnO), indium gallium zinc oxide (IGZO), and indium tin zinc oxide (ITZO), and a conductive polymer such as poly(3,4-ethylenedioxythiophene) (PEDOT). However, the first capping layer CP1 is not limited to the above-described example.

The first capping layer CP1 may prevent a reaction between the bridge pattern BRP and an etchant for forming the pixel electrode PE which will be described below. This is described below in detail with reference to FIGS. 5 and 6.

The display element portion DPL may be disposed on the pixel circuit portion PCL. The display element portion DPL may include the pixel electrode PE, a connection electrode COL, an insulating layer INS, the light emitting element LD, and the common electrode CE. According to an embodiment, individual configurations of the display element portion DPL may be defined in each of the first to third sub pixels SPXL1, SPXL2, and SPXL3.

The pixel electrode PE may be disposed on the second organic layer VIA2. The pixel electrode PE may be disposed under the light emitting element LD. The pixel electrode PE may be electrically connected to the bridge pattern BRP through the first contact hole CNT1.

According to an embodiment, the pixel electrode PE may be electrically connected to the light emitting element LD. According to an embodiment, the pixel electrode PE may provide an electrical signal, provided from the first transistor T1, to the light emitting element LD. The pixel electrode PE may apply an anode signal to the light emitting element LD.

According to an embodiment, the pixel electrode PE may include a conductive material. In an embodiment, the pixel electrode PE may be multiple metal layers including copper (Cu) and titanium (Ti), such as a Cu/Ti double layer. The Cu/Ti double layer uses copper (Cu) as a metal electrode having a low resistance value, and uses a titanium (Ti) layer as a diffusion prevention layer under a copper (Cu) layer. However, the pixel electrode PE is not limited to the above-described example. The pixel electrode PE may use titanium (Ti) as a diffusion prevention layer and may include a metal such as silver (Ag), magnesium (Mg), aluminum (Al), platinum (Pt), palladium (Pd), gold (Au), nickel (Ni), neodymium (Nd), iridium (Ir), chromium (Cr), and an alloy thereof, as a metal electrode having a low resistance value.

Referring to FIG. 5, a lower metal pattern BMTP (for example, the bridge pattern BRP) insulated from the pixel electrode PE by an insulating layer PI (for example, the second organic layer VIA2) may be disposed on a lower layer BTL (for example, the first organic layer VIA1) of the pixel electrode PE. According to an embodiment, the pixel electrode PE may be formed in a desired pattern by etching the double layer of copper/titanium (Cu/Ti) using an etchant ET. For example, a hydrogen peroxide-based composition may be used as the etchant ET.

While a process of patterning the pixel circuit portion PCL (refer to FIG. 4) is performed, the lower metal pattern BMTP may be exposed to the outside in case that an opening OPN is formed in the insulating layer PI. According to an embodiment, the lower metal pattern BMTP may be a triple metal layer structure of titanium/aluminum/titanium (Ti/Al/Ti). In such a case, the etchant ET used in the etching process of the pixel electrode PE may react with not only the double layer of copper/titanium (Cu/Ti) but also the upper titanium (Ti) layer of the lower metal pattern BMTP exposed by the opening OPN, and thus the lower metal pattern BMTP may be unintendedly etched.

In the disclosure, in order to prevent such a problem, as in the opening OPN shown on the left, the capping layer CP may be disposed on the lower metal pattern BMTP and the insulating layer PI. According to an embodiment, the capping layer CP may be a transparent conductive material such as indium tin oxide (ITO). The ITO is not etched by the etchant ET for etching the pixel electrode PE, and since the ITO is a conductive material, the ITO does not interfere an electrical connection of the lower metal pattern BMTP.

However, a disposition example of the capping layer CP is not limited thereto, and various modifications are possible as long as the capping layer CP has a structure capable of covering an exposed region of the lower metal pattern BMTP. For example, as shown in FIG. 6, the lower metal pattern BMTP, the capping layer CP, and the insulating layer PI may be sequentially stacked. In this case, the capping layer CP may be directly disposed on the entire surface of the upper Ti layer of the lower metal pattern BMTP. Accordingly, even though the opening OPN is formed in the insulating layer PI, the upper Ti layer may not be exposed to the outside. Although not shown in the drawing, the capping layer CP may be disposed to cover not only an upper surface of the lower metal pattern BMTP but also both side surfaces.

Referring to FIG. 4 again, the connection electrode COL may be disposed on the pixel electrode PE. In an embodiment, a surface of the connection electrode COL may be electrically connected to the light emitting element LD, and another surface of the connection electrode COL may be electrically connected to the pixel electrode PE.

The connection electrode COL may include a conductive material and may electrically connect the pixel electrode PE and the light emitting element LD. In an embodiment, the connection electrode COL may be electrically connected to a second semiconductor layer 13 of the light emitting element LD. According to an embodiment, the connection electrode COL may include a conductive material having a reflective property, reflect light emitted from the light emitting element LD, and improve light emission efficiency of the pixel PXL.

According to an embodiment, the connection electrode COL may be a bonding metal bonding-combined (or connected) to the light emitting element LD. The connection electrode COL may be bonding-combined to the light emitting element LD.

The light emitting element LD may be included in each of the first to third sub pixels SPXL1, SPXL2, and SPXL3. The light emitting element LD is configured to emit light. The light emitting element LD may include a first semiconductor layer 11, the second semiconductor layer 13, and an active layer 12 interposed between the first and second semiconductor layers 11 and 13. In an embodiment, in case that an extension direction of the light emitting element LD is a length direction, the light emitting element LD may include the first semiconductor layer 11, the active layer 12, and the second semiconductor layer 13 sequentially stacked in the length direction.

According to an embodiment, the light emitting element LD may be provided in a column shape extending in a direction. The light emitting element LD may have a first end portion EP1 and a second end portion EP2. One of the first and second semiconductor layers 11 and 13 may be adjacent to the first end portion EP1 of the light emitting element LD. The other of the first and second semiconductor layers 11 and 13 may be adjacent to the second end portion EP2 of the light emitting element LD.

According to an embodiment, the light emitting element LD may be a light emitting element manufactured in a column shape by an etching method or the like. In the specification, the term "column shape" encompasses a rod-like shape or a bar-like shape that is long in a length direction (for example, having an aspect ratio greater than 1), such as a circular column or a polygonal column, and a shape of a cross section is not particularly limited. For example, a length of the light emitting element LD may be greater than a diameter (or a width of the cross section) thereof.

According to an embodiment, the light emitting element LD may have a size as small as nano scale to micro scale (nanometer scale to micrometer scale). In an embodiment, each of the light emitting elements LD may have a diameter (or width) and/or a length of a nanoscale to microscale range. However, the size of the light emitting element LD is not limited thereto.

The first semiconductor layer 11 may be a first conductivity type semiconductor layer. For example, the first semiconductor layer 11 may include an N-type semiconductor layer. In an embodiment, the first semiconductor layer 11 may include a semiconductor material among InAlGaN, GaN, AlGaN, InGaN, AlN, and InN and may include an N-type semiconductor layer doped with a first conductivity type dopant such as Si, Ge, and Sn. However, the material configuring the first semiconductor layer 11 is not limited thereto.

The active layer 12 may be disposed on the first semiconductor layer 11 and may be formed in a single-quantum well or multi-quantum well structure. In an embodiment, in case that the active layer 12 is formed in the multi-quantum well structure, the active layer 12 may include a barrier layer (not shown), a strain reinforcing layer, and a well layer repeatedly stacked periodically as one part. The strain reinforcing layer may have a lattice constant smaller than that of the barrier layer, and thus may further reinforce a strain, for example, a compression strain, applied to the well layer. However, a structure of the active layer 12 is not limited to the above-described embodiment.

According to an embodiment, the active layer 12 may emit light having a wavelength of about 400 nm to about 900 nm. According to an embodiment, the active layer 12 may include a material such as AlGaN and InAlGaN, but the disclosure is not limited to the above-described example.

The second semiconductor layer 13 may be disposed on the active layer 12 and may include a semiconductor layer of a type different from that of the first semiconductor layer 11. For example, the second semiconductor layer 13 may include a P-type semiconductor layer. In an embodiment, the second semiconductor layer 13 may include at least one semiconductor material among InAlGaN, GaN, AlGaN, InGaN, AlN, and InN and may include a P-type semiconductor layer doped with a second conductivity type dopant such as Mg. However, the material configuring the second semiconductor layer 13 is not limited thereto, and various other materials may configure the second semiconductor layer 13.

In case that a voltage greater than or equal to a threshold voltage is applied to both ends of the light emitting element LD, electron-hole pairs are combined in the active layer 12, and thus the light emitting element LD emits light. By controlling the light emission of the light emitting element LD using this principle, the light emitting element LD may be used as a light source of various light emitting devices including a pixel of a display device.

According to an embodiment, the light emitting element LD may further include an insulating film INF provided on a surface. The insulating film INF may be formed of a single film or a double film, but the disclosure is not limited thereto, and the insulating film INF may be formed of films. In an embodiment, the insulating film INF may include a first insulating film including a first material and a second insulating film including a second material different from the first material.

According to an embodiment, the insulating film INF may expose both end portions of the light emitting element LD having different polarities. For example, the insulating film INF may expose an end of each of the first and second semiconductor layers 11 and 13 positioned at the first and second end portions EP1 and EP2 of the light emitting element LD.

According to an embodiment, the insulating film INF may include an inorganic material. In an embodiment, the insulating film INF may be configured of a single layer or multiple layers by including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the disclosure is not limited thereto.

According to an embodiment, the insulating film INF may ensure electrical stability of the light emitting element LD. Even though light emitting elements LD are disposed closely with each other, an unwanted short circuit may be prevented from occurring between the light emitting elements LD.

According to an embodiment, the light emitting element LD may further include an additional configuration in addition to the above-described configuration. For example, the light emitting element LD may additionally include at least one phosphor layer, active layer, semiconductor layer and/or electrode layer disposed on an end side of the first semiconductor layer 11, the active layer 12 and/or the second semiconductor layer 13. In an embodiment, a contact electrode layer may be further disposed on each of the first and second end portions EP1 and EP2 of the light emitting element LD.

The insulating layer INS may be disposed on the second organic layer VIA2. The insulating layer INS may cover (or overlap) at least a portion of the pixel electrode PE and/or the connection electrode COL. The insulating layer INS may be provided between the light emitting elements LD bonding-combined to the connection electrode COL. The insulating layer INS may be disposed between the light emitting elements LD and cover (or overlap) an outer surface of the light emitting element LD. According to an embodiment, the insulating layer INS may include any of materials that may form the insulating film INF, but the disclosure is not limited thereto.

The common electrode CE may be disposed on the insulating layer INS. The common electrode CE may be disposed on the light emitting element LD.

According to an embodiment, the common electrode CE may be electrically connected to the light emitting element LD. The common electrode CE may be electrically connected to the first semiconductor layer 11. According to an embodiment, the common electrode CE may apply a cathode signal to the light emitting element LD. The common electrode CE may provide an electrical signal, supplied from the second power voltage line VSSL, to the light emitting element LD.

According to an embodiment, the common electrode CE may include a conductive material. In an embodiment, the common electrode CE may include a transparent conductive material. The common electrode CE may include any of a conductive oxide such as indium tin oxide (ITO), indium zinc oxide (IZO), zinc oxide (ZnO), indium gallium zinc oxide (IGZO), and indium tin zinc oxide (ITZO), and a conductive polymer such as PEDOT (poly(3,4-ethylenedioxythiophene)). However, the common electrode CE is not limited to the above-described example.

The common electrode CE may be electrically connected to the second power voltage line VSSL by a connection pattern CNTP (refer to FIGS. 8A and 8B), and the connection pattern CNTP and the bridge pattern BRP may be formed on the same layer. Since the connection pattern CNTP is exposed to the etchant ET (refer to FIG. 6) in the etching process for forming the pixel electrode PE, a second capping layer CP2 may also be disposed on the connection pattern CNTP. The second capping layer CP2 is described in detail below with reference to FIGS. 8A and 8B.

The light control portion LCP may be disposed on the display element portion DPL. The light control portion LCP may change a wavelength of light provided from the display element portion DPL. The light control portion LCP may include a color conversion portion CCL and a color filter portion CFL.

According to an embodiment, the light emitting elements LD disposed in each of the first sub pixel SPXL1, the second sub pixel SPXL2, and the third sub pixel SPXL3 may emit light of a same color. For example, the first sub pixel SPXL1, the second sub pixel SPXL2, and the third sub pixel SPXL3 may include light emitting elements LD emitting light of a third color, as an embodiment, blue light. The light control portion LCP may be disposed on the first sub pixel SPXL1, the second sub pixel SPXL2, and the third sub pixel SPXL3 to display a full-color image. However, the disclosure is not limited thereto, and the first sub pixel SPXL1, the second sub pixel SPXL2, and the third sub pixel SPXL3 may include light emitting elements LD emitting light of different colors.

The color conversion portion CCL may include a first passivation layer PSS1, a wavelength conversion pattern WCP, a light transmission pattern LTP, a light blocking layer LBL, and a second passivation layer PSS2. The wavelength conversion pattern WCP may include a first wavelength conversion pattern WCP1 and a second wavelength conversion pattern WCP2.

The first passivation layer PSS1 may be disposed between the display element portion DPL and the light blocking layer LBL or the wavelength conversion pattern WCP. The first passivation layer PSS1 may seal (or cover or overlap) the wavelength conversion pattern WCP. The first passivation layer PSS1 may include any of materials that may form the insulating film INF, but the disclosure is not limited to a specific example.

Although not shown in the drawing, an adhesive layer may be interposed between the first passivation layer PSS1 and the common electrode CE. The adhesive layer may combine the first passivation layer PSS1 and the common electrode CE. The adhesive layer may include an adhesive material, and the disclosure is not limited to a specific example.

The first wavelength conversion pattern WCP1 may be disposed to overlap an emission area EMA (for example, the first sub pixel area SPXA1) of the first sub pixel SPXL1. For example, the first wavelength conversion pattern WCP1 may be disposed in a space defined by the light blocking layer LBL and may overlap the first sub pixel area SPXA1 when viewed in a plan view.

According to an embodiment, the light blocking layer LBL may include walls, and the first wavelength conversion pattern WCP1 may be provided in a space between the walls disposed in an area corresponding to the first sub pixel SPXL1.

The second wavelength conversion pattern WCP2 may be disposed to overlap the emission area EMA (for example, the second sub pixel area SPXA2) of the second sub pixel SPXL2. For example, the second wavelength conversion pattern WCP2 may be disposed in a space defined by the light blocking layer LBL and may overlap the second sub pixel area PXA2 when viewed in a plan view.

According to an embodiment, the light blocking layer LBL may include walls, and the second wavelength conversion pattern WCP2 may be provided in a space between the walls disposed in an area corresponding to the second sub pixel PXL2.

The light transmission pattern LTP may be disposed to overlap the emission area EMA (for example, the third sub pixel area SPXA3) of the third sub pixel SPXL3. For example, the light transmission pattern LTP may be disposed in a space defined by the light blocking layer LBL and may overlap the third sub pixel area SPXA3 when viewed in a plan view.

According to an embodiment, the light blocking layer LBL may include walls, and the light transmission pattern LTP may be provided in a space between the walls disposed in an area corresponding to the third sub pixel SPXL3.

According to an embodiment, the first wavelength conversion pattern WCP1 may include first color conversion particles that convert light of a third color emitted from the light emitting element LD, into light of a first color. In an embodiment, in case that the light emitting element LD is a blue light emitting element emitting blue light, and the first sub pixel SPXL1 is a red pixel, the first wavelength conversion pattern WCP1 may include a first quantum dot that converts the blue light, emitted from the blue light emitting element, into red light.

For example, the first wavelength conversion pattern WCP1 may include first quantum dots dispersed in a predetermined matrix material such as a base resin. The first quantum dot may absorb the blue light and shift a wavelength thereof according to an energy transition to emit the red light. In case that the first sub pixel SPXL1 is a pixel of a different color, the first wavelength conversion pattern WCP1 may include a first quantum dot corresponding to the color of the first sub pixel PXL1.

According to an embodiment, the second wavelength conversion pattern WCP2 may include second color conversion particles that convert light of a third color emitted from the light emitting element LD, into light of a second color. In an embodiment, in case that the light emitting element LD is a blue light emitting element emitting blue light, and the second sub pixel SPXL2 is a green pixel, the second wavelength conversion pattern WCP2 may include a second quantum dot that converts the blue light emitted from the blue light emitting element into green light.

For example, the second wavelength conversion pattern WCP2 may include second quantum dots dispersed in a predetermined matrix material such as a base resin. The second quantum dot may absorb the blue light and shift a wavelength according to an energy transition to emit the green light. In case that the second sub pixel SPXL2 is a pixel of a different color, the second wavelength conversion pattern WCP2 may include a second quantum dot corresponding to the color of the second sub pixel SPXL2.

The first quantum dot and the second quantum dot may have a shape of a sphere, a pyramid, a multi-arm, a cubic nanoparticle, a nanotube, a nanowire, a nanofiber, a nanoplate particle, or the like, but the disclosure is not limited thereto, and the shape of the first quantum dot and the second quantum dot may be variously changed.

In an embodiment, an absorption coefficient of the first quantum dot and the second quantum dot may be increased by injecting the blue light having a relatively short wavelength in a visible light area to each of the first quantum dot and the second quantum dot. Accordingly, finally, efficiency of light emitted from the first sub pixel SPXL1 and the second sub pixel SPXL2 may be increased, and excellent color reproducibility may be secured. Manufacturing efficiency of the display device may be increased by configuring the pixel part of the first to third sub pixels SPXL1, SPXL2, and SPXL3 by using the light emitting elements LD (for example, blue light emitting elements) of the same color.

According to an embodiment, the light transmission pattern LTP may be provided to efficiently use the light of the third color emitted from the light emitting element LD. In an embodiment, in case that the light emitting element LD is a blue light emitting element emitting blue light and the third sub pixel SPXL3 is a blue pixel, the light transmission pattern LTP may include at least one type of light scattering particles in order to efficiently use the light emitted from the light emitting element LD.

For example, the light transmission pattern LTP may include light scattering particles dispersed in a predetermined matrix material such as a base resin. In an embodiment, the light transmission pattern LTP may include light scattering particles such as silica, but a material of the light scattering particles is not limited thereto.

The light scattering particles may not be disposed in the third sub pixel area SPXA3 in which the third sub pixel SPXL3 is formed. In an embodiment, the light scattering particles may be selectively included in the first wavelength conversion pattern WCP1 and/or the second wavelength conversion pattern WCP2.

The light blocking layer LBL may be disposed on the display element portion DPL. The light blocking layer LBL may be disposed on the substrate SUB. The light blocking layer LBL may be disposed between the first passivation layer PSS1 and the second passivation layer PSS2. The light blocking layer LBL may be disposed to surround the first wavelength conversion pattern WCP1, the second wavelength conversion pattern WCP2, and the light transmission pattern LTP at a boundary between the sub pixels SPXL.

According to an embodiment, the light blocking layer LBL may define the emission area EMA and a non-emission area NEA of the sub pixel SPXL. The light blocking layer LBL may define the first to third sub pixel areas SPXA1, SPXA2, and SPXA3.

In an embodiment, the light blocking layer LBL may not overlap the emission area EMA when viewed in a plan view. The light blocking layer LBL may overlap the non-emission area NEA when viewed in a plan view. An area in which the light blocking layer LBL is not disposed may be defined as the emission area EMA of the first to third sub pixels SPXL1, SPXL2, and SPXL3. The emission area EMA of the first sub pixel SPXL1 may be the first sub pixel area SPXA1, the emission area EMA of the second sub pixel SPXL2 may be the second sub pixel area SPXA2, and the emission area EMA of the third sub pixel SPXL3 may be the third sub pixel area SPXA3.

According to an embodiment, the light blocking layer LBL may be formed of an organic material including at least one of graphite, carbon black, black pigment, or black dye, or may be formed of a metal material including chromium (Cr), but is not limited as long as the material of the light blocking layer LBL is a material capable of blocking light transmission and absorbing light.

The second passivation layer PSS2 may be disposed between the color filter portion CFL and the light blocking layer LBL. The second passivation layer PSS2 may seal (or cover) the first wavelength conversion pattern WCP1, the second wavelength conversion pattern WCP2, and the light transmission pattern LTP. The second passivation layer PSS2 may include one of materials that may form the insulating film INF, but the disclosure is not limited to a specific example.

According to an embodiment, the color filter portion CFL may be disposed on the color conversion portion CCL. The color filter portion CFL may include a color filter CF and a planarization layer PLA. The color filter CF may include a first color filter CF1, a second color filter CF2, and a third color filter CF3.

According to an embodiment, the color filter CF may be disposed on the second passivation layer PSS2. When viewed in a plan view, the color filter CF may overlap the emission area EMA of the first to third sub pixels SPXL1, SPXL2, and SPXL3.

For example, the first color filter CF1 may be disposed in the first sub pixel area SPXA1, the second color filter CF2 may be disposed in the second sub pixel area SPXA2, and the third color filter CF3 may be disposed in the third sub pixel area SPXA3.

According to an embodiment, the first color filter CF1 may transmit light of a first color and may not transmit light of a second color and light of a third color. In an embodiment, the first color filter CF1 may include a colorant of the first color.

According to an embodiment, the second color filter CF2 may transmit the light of the second color and may not transmit the light of the first color and the light of the third color. In an embodiment, the second color filter CF2 may include a colorant of the second color.

According to an embodiment, the third color filter CF3 may transmit the light of the third color and may not transmit the light of the first color and the light of the second color. In an embodiment, the third color filter CF3 may include a colorant of the third color.

According to an embodiment, the planarization layer PLA may be disposed on the color filter CF. The planarization layer PLA may cover the color filter CF. The planarization layer PLA may cancel a step difference (or height difference) generated by the color filter CF.

According to an embodiment, the planarization layer PLA may include an organic insulating material. However, the disclosure is not limited thereto, and the planarization layer PLA may include an inorganic material that may form the insulating film INF.

A structure of the first to third sub pixels SPXL1, SPXL2, and SPXL3 is not limited to the contents described above with reference to FIG. 4, and various structures may be appropriately selected to provide the display device DD according to an embodiment. In an embodiment, the display device DD may further include a low refractive index layer to improve light efficiency.

Figure 7:
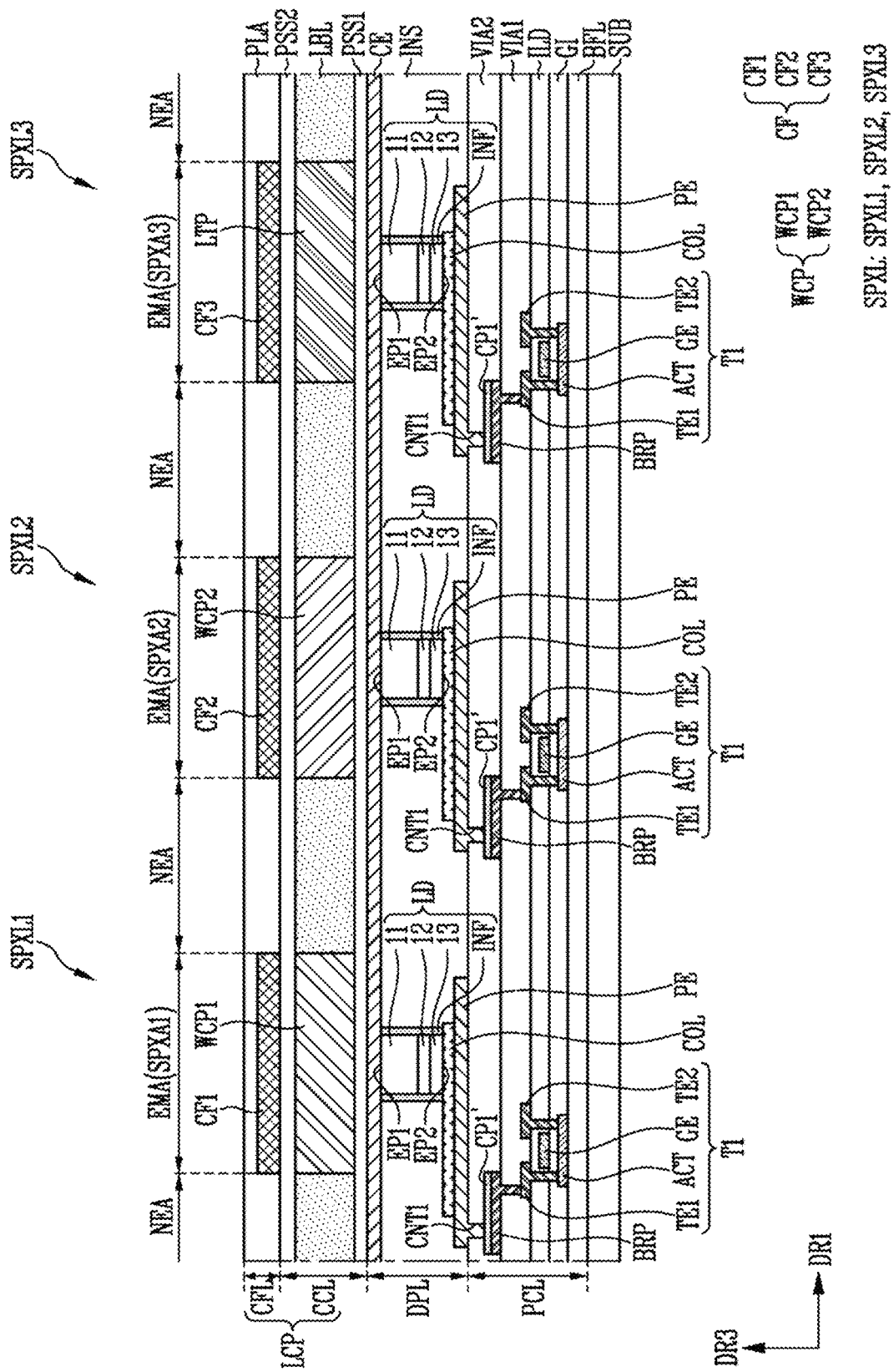
FIG. 7 is a cross-sectional view schematically illustrating a pixel according to another embodiment.

FIG. 7 is a cross-sectional view schematically illustrating a pixel according to an embodiment.

Referring to FIG. 7, the embodiment shown in FIG. 7 is different from the embodiment shown in FIG. 4 in that the bridge pattern BRP, the second organic layer VIA2, and a (1_1)-th capping layer CP1' are sequentially stacked. Since other configurations are substantially the same as those of the embodiment shown in FIG. 4, a repetitive description is omitted.

The bridge pattern BRP may be multiple layers. For example, the bridge pattern BRP may be a triple metal layer structure of titanium/aluminum/titanium (Ti/Al/Ti). The (1_1)-th capping layer CP1' may be directly disposed on the entire surface of the bridge pattern BRP. In other words, the (1_1)-th capping layer CP1' may be disposed on the bridge pattern BRP exposed by the first contact hole CNT1 formed in the second organic layer VIA2 and may be disposed to cover the entire upper surface of the bridge pattern BRP. However, although not shown in the drawing, the (1_1)-th capping layer CP1' may be disposed to cover not only the upper surface but also both side surfaces of the bridge pattern BRP.

Similar to the first capping layer CP1, the (1_1)-th capping layer CP1' may include a transparent conductive material. Accordingly, even though the first contact hole CNT1 is formed in the second organic layer VIA2, the bridge pattern BRP may not be exposed to the etchant ET (refer to FIG. 5) for forming the pixel electrode PE. In this case, the pixel electrode PE may be multiple layers including copper (Cu) and titanium (Ti) such as a Cu/Ti double layer.

Figure 8A:
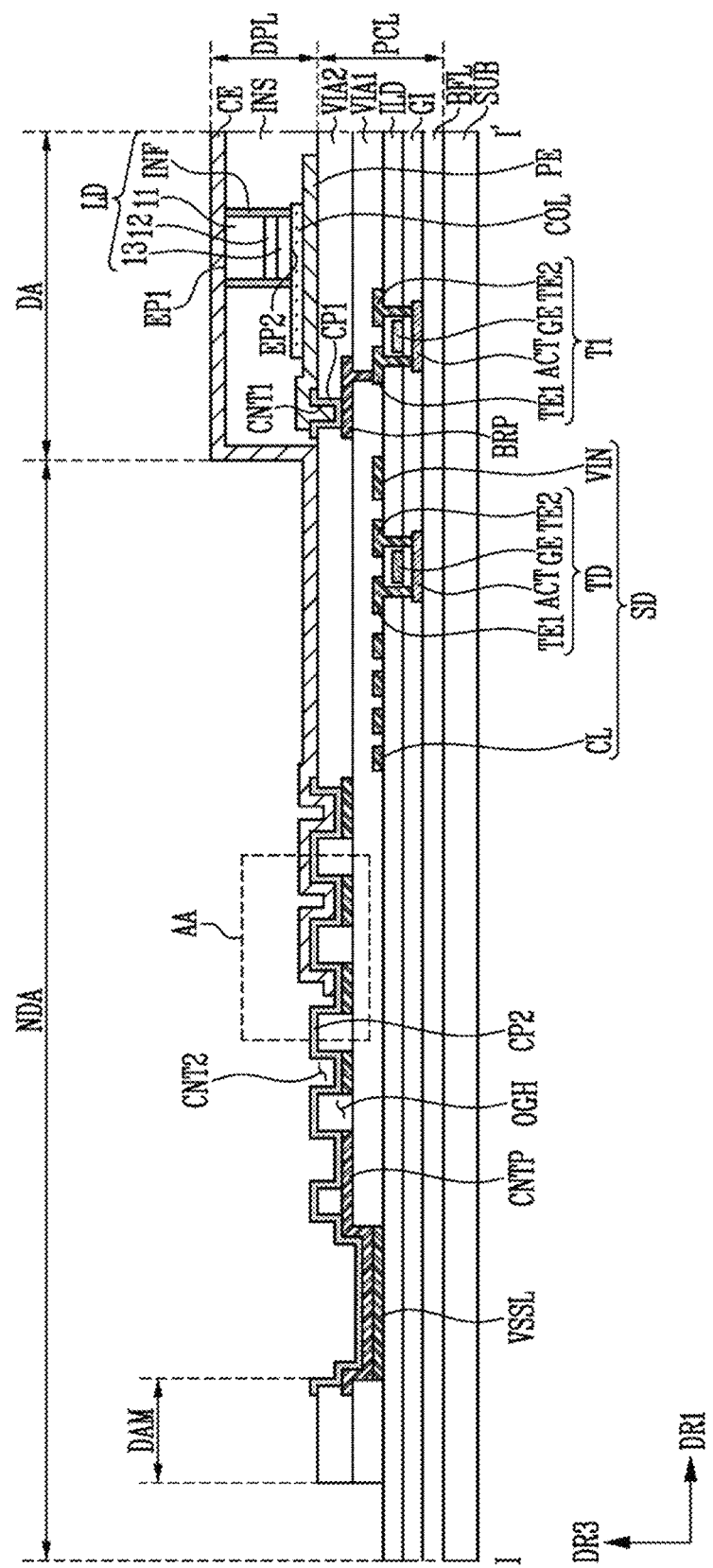
FIGS. 8A to 10B are diagrams illustrating a specific position where a capping layer is formed in a display device according to an embodiment.
Figure 8B:
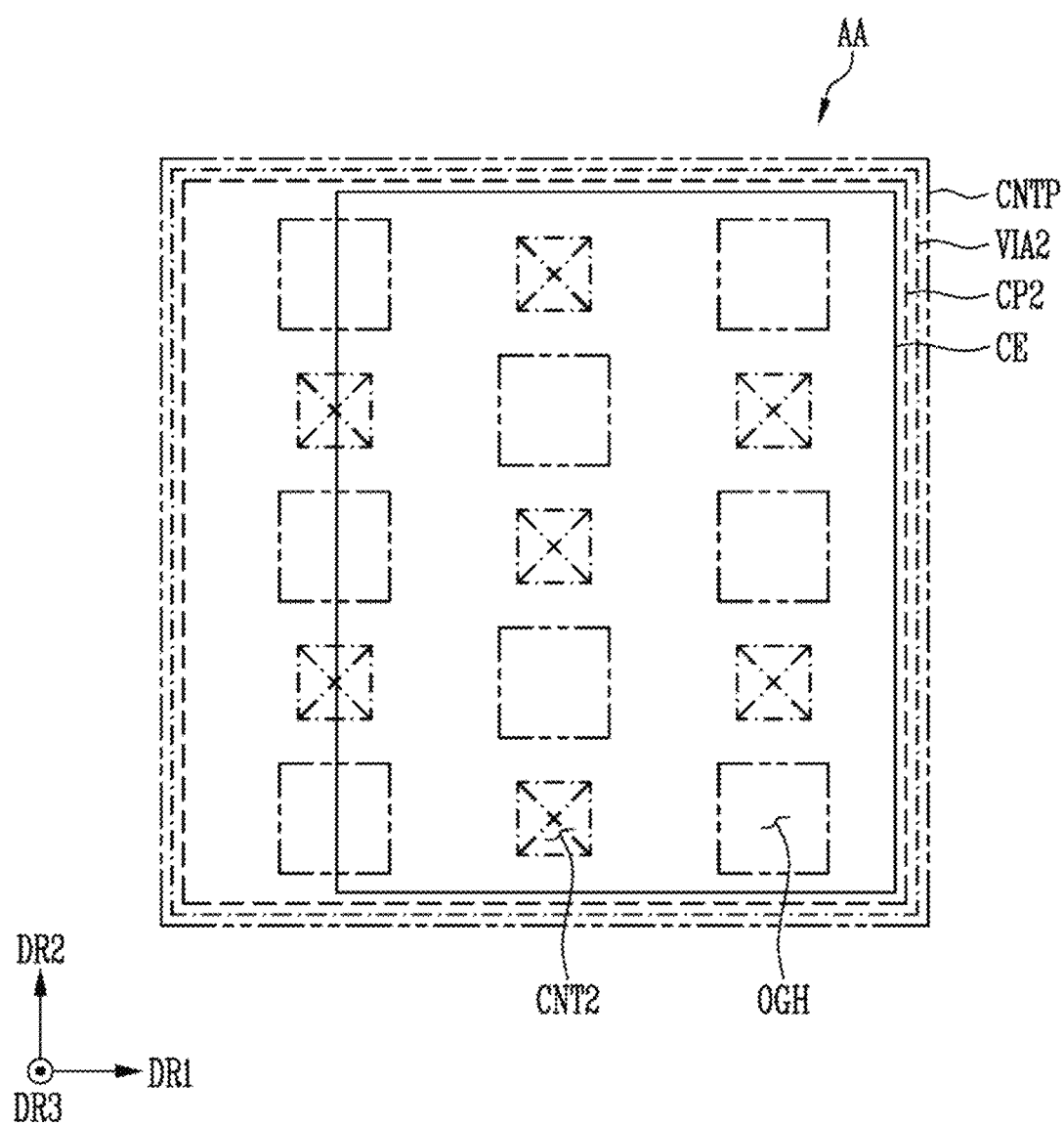
Figure 9A:
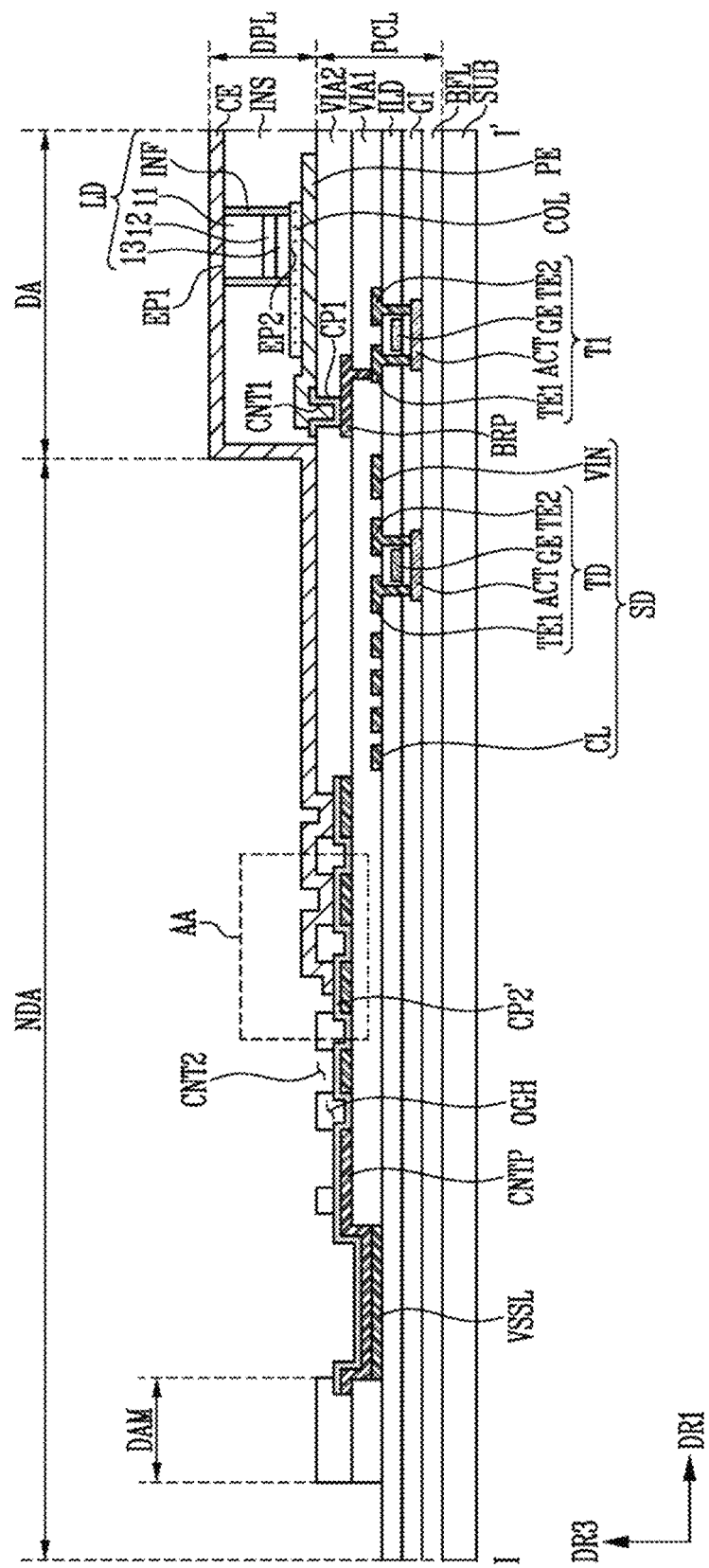
Figure 9B:
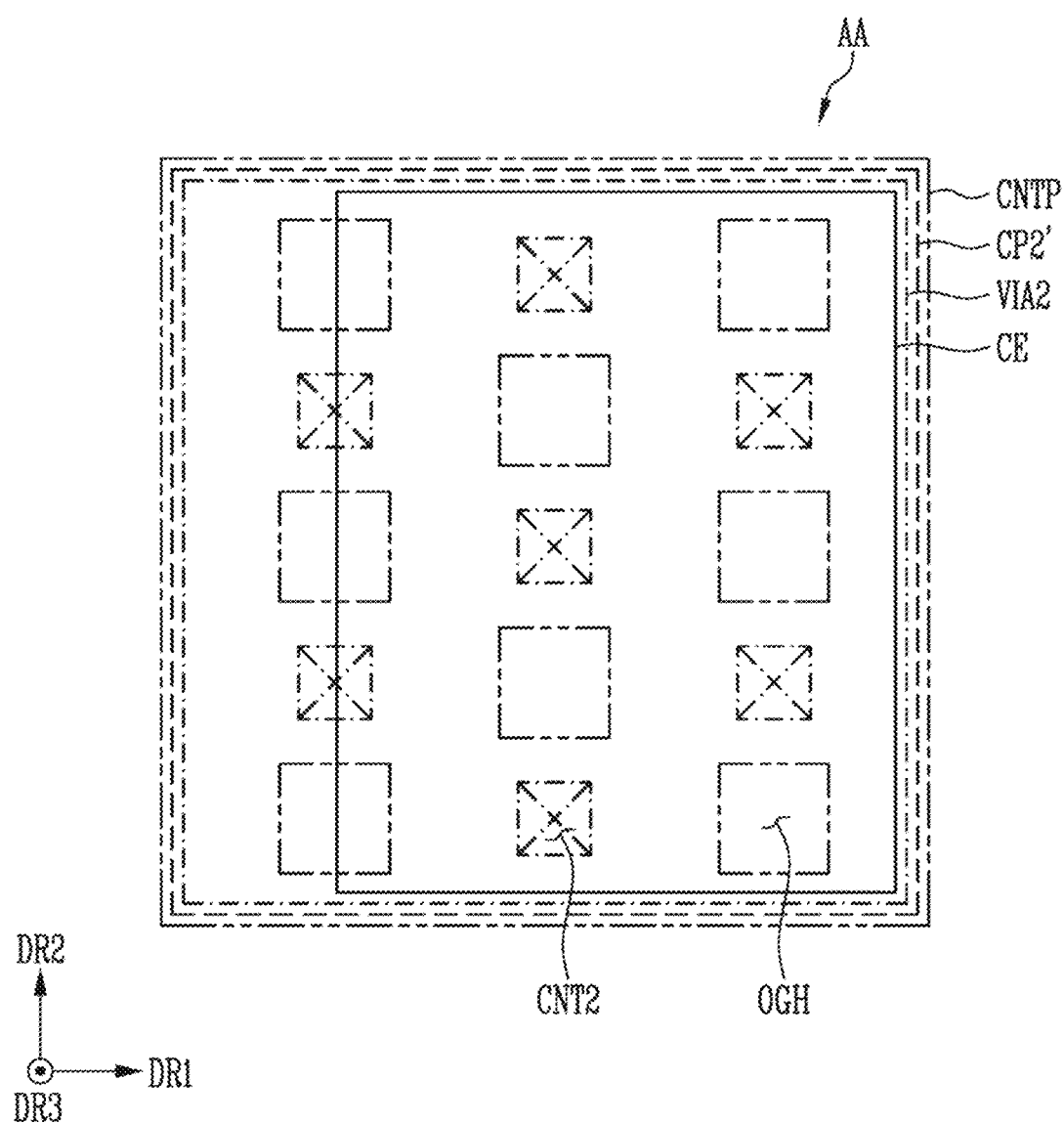
Figure 10A:
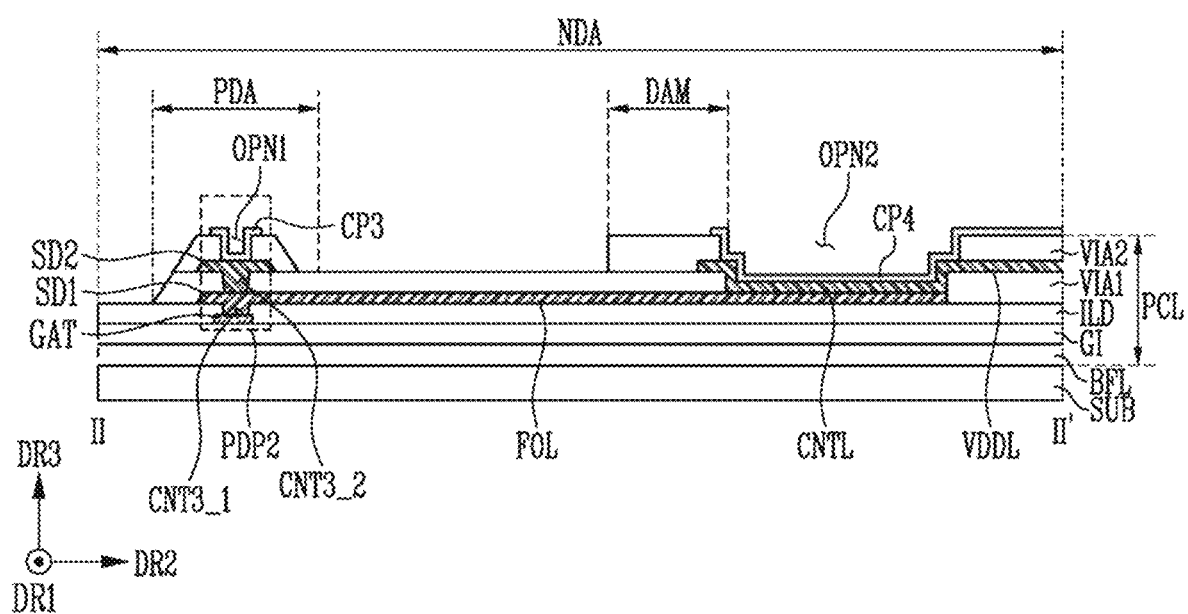
Figure 10B:
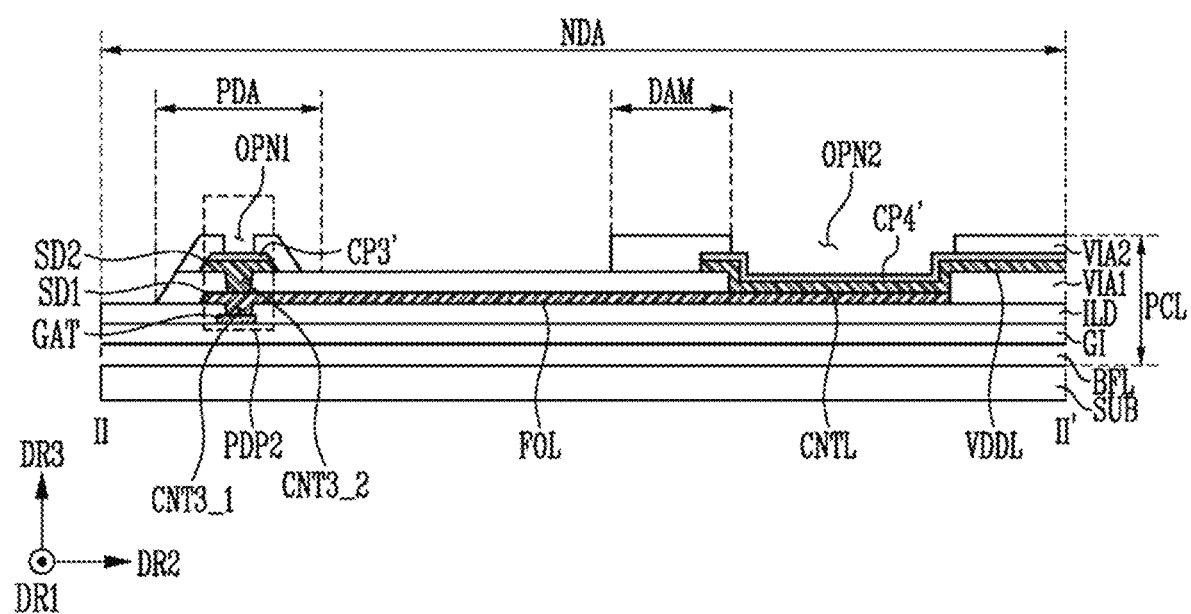

FIGS. 8A to 10B are schematic diagrams illustrating a specific position where capping layers are formed in a display device according to an embodiment. In this case, FIGS. 8A and 9A are schematic cross-sectional views taken along line I-I' of FIG. 2, and FIGS. 8B and 9B are schematic enlarged views of AA region of FIG. 2. FIGS. 10A and 10B are schematic cross-sectional views taken along line II-II' of FIG. 2.

First, the second capping layer CP2 disposed on the connection pattern CNTP is described with reference to FIGS. 2, 4, and 8A. Since the contents of the configuration corresponding to the display area DA are repetitive to the contents described with reference to FIG. 4, the descriptions of the configuration corresponding to the display area Da are omitted, and a configuration corresponding to the non-display area NDA is mainly described. In FIG. 8A, for convenience of description, the light control portion LCP is omitted, and only the pixel circuit portion PCL and the display element portion DPL are shown.

The dam portion DAM may be formed by etching the first organic layer VIA1 and the second organic layer VIA2. The second power voltage line VSSL may be disposed on the interlayer insulating layer ILD along a side of the dam portion DAM. The second power voltage line VSSL may be disposed in the non-display area NDA to provide a second power voltage of the same potential to each of the pixels PXL.

The scan driver SD may be disposed between the display area DA and the second power voltage line VSSL. The scan driver SD may include at least one driving transistor TD and conductive lines CL and VIN. FIGS. 8A and 9A illustrate that the driving transistor TD and the first transistor T1 have the same structure, but the disclosure is not limited thereto, and the driving transistor TD and the first transistor T1 may have different structures. The conductive lines CL and VIN may be electrically connected to the driving transistor TD or the like to form an electronic circuit.

The common electrode CE may be formed on the entire surface of the display area DA. The common electrode CE may extend from the display area DA to the non-display area NDA to be electrically connected to the connection pattern CNTP. The connection pattern CNTP may electrically connect the common electrode CE and the second power voltage line VSSL.

The connection pattern CNTP and the bridge pattern BRP may be formed of the same material and may be formed simultaneously. The connection pattern CNTP may be disposed on the first organic layer VIA1. The connection pattern CNTP may be electrically connected to the common electrode CE by a second contact hole CNT2 formed in the second organic layer VIA2. The connection pattern CNTP may include a metal layer. The connection pattern CNTP may be multiple layers. For example, the connection pattern CNTP may be a triple metal layer structure of titanium/aluminum/titanium (Ti/Al/Ti).

Similar to the bridge pattern BRP, the second capping layer CP2 may be disposed on the connection pattern CNTP to prevent reaction between the etchant for forming the pixel electrode PE and the connection pattern CNTP. According to an embodiment, the second capping layer CP2 may be disposed on the second organic layer VIA2 and the connection pattern CNTP exposed by the second contact hole CNT2.

The second capping layer CP2 may include a transparent conductive material. The second capping layer CP2 may include any of conductive oxides such as indium tin oxide (ITO), indium zinc oxide (IZO), zinc oxide (ZnO), indium gallium zinc oxide (IGZO), and indium tin zinc oxide (ITZO), and a conductive polymer such as PEDOT(poly(3, 4-ethylenedioxythiophene)). However, the second capping layer CP2 is not limited to the above-described example.

Referring to FIGS. 8A and 8B, the connection pattern CNTP, the second organic layer VIA2, the second capping layer CP2, and the common electrode CE may be sequentially stacked in the AA region.

The connection pattern CNTP may include through holes OGH spaced apart at uniform distances. The through holes OGH according to an embodiment may have a quadrangle shape. The through holes OGH may be provided for preventing occurrence of an air bubble due to outgas generated from the first organic layer VIA1 on which the connection pattern CNTP is disposed during a process of forming the pixel circuit portion PCL, and the outgas may be discharged to the outside through the through holes OGH.

The second organic layer VIA2 may be disposed on the connection pattern CNTP and the first organic layer VIA1. The second organic layer VIA2 may have second contact holes CNT2 at positions where the second organic layer VIA2 does not overlap the through holes OGH in the third direction DR3.

The second capping layer CP2 may be disposed on the connection pattern CNTP and the second organic layer VIA2. The second capping layer CP2 may cover (or overlap) the connection pattern CNTP exposed to the outside by the second contact hole CNT2 formed in the second organic layer VIA2. Accordingly, the connection pattern CNTP may be prevented from physically contacting the etchant for forming the pixel electrode PE, and the second capping layer CP2 may not chemically react with the etchant. Thus, the connection pattern CNTP may be prevented from being damaged by the etchant.

The common electrode CE may be disposed on the second capping layer CP2. FIG. 8B illustrates that only a partial region of the common electrode CE overlaps the second capping layer CP2 in a plan view, but this is only an example, and the common electrode CE may completely overlap the second capping layer CP2 according to a process margin. Since the second capping layer CP2 is configured of a transparent conductive material, the common electrode CE and the second connection pattern CNTP may be electrically connected.

The embodiment shown in FIGS. 9A and 9B is different from the embodiment shown in FIGS. 8A and 8B, in which the connection pattern CNTP, the second organic layer VIA2, the second capping layer CP2, and the common electrode CE are sequentially stacked in region AA, in that the connection pattern CNTP, a (2_1)-th capping layer CP2', the second organic layer VIA2, and the common electrode CE are sequentially stacked in region AA. A repetitive description is omitted, and differences are mainly described.

The connection pattern CNTP may be disposed on the first organic layer VIA1. The connection pattern CNTP may be electrically connected to the common electrode CE through the second contact hole CNT2 formed in the second organic layer VIA2. The connection pattern CNTP may include a metal. The connection pattern CNTP may be multiple layers. For example, the connection pattern CNTP may be a triple metal layer structure of titanium/aluminum/titanium (Ti/Al/Ti).

Therefore, similar to the bridge pattern BRP, the (2_1)-th capping layer CP2' may be disposed on the connection pattern CNTP to prevent the reaction between the etchant for forming the pixel electrode PE and the connection pattern CNTP. According to an embodiment, the (2_1)-th capping layer CP2' may be disposed on the connection pattern CNTP and the first organic layer VIA1 exposed by the through hole OGH. The (2_1)-th capping layer CP2_1 may include a transparent conductive material.

Referring to FIGS. 9A and 9B, the connection pattern CNTP, the (2_1)-th capping layer CP2', the second organic layer VIA2, and the common electrode CE may be sequentially stacked in region AA.

The connection pattern CNTP may include through holes OGH spaced apart at uniform distances. The through holes OGH according to an embodiment may have a quadrangle shape. The through holes OGH may be provided for preventing occurrence of an air bubble due to outgas generated from the first organic layer VIA1 on which the connection pattern CNTP is disposed during a process of forming the pixel circuit portion PCL, and the outgas may be discharged to the outside through the through holes OGH.

The (2_1)-th capping layer CP2' may be disposed on the connection pattern CNTP and the first organic layer VIA1 exposed by the through hole OGH.

The second organic layer VIA2 may be disposed on the (2_1)-th capping layer CP2'. The second organic layer VIA2 may have second contact holes CNT2 at positions where the second organic layer VIA2 does not overlap the through holes OGH in the third direction DR3.

Since the (2_1)-th capping layer CP2' covers the connection pattern CNTP even though the second contact hole CNT2 is formed in the second organic layer VIA2, the connection pattern CNTP may be prevented from being exposed to the outside. Accordingly, the connection pattern CNTP may be prevented from physically contacting the etchant ET (refer to FIG. 5) for forming the pixel electrode PE, and the (2_1)-th capping layer CP2' may not chemically react with the etchant ET (refer to FIG. 5). Thus, the connection pattern CNTP may be prevented from being damaged by the etchant ET (refer to FIG. 5).

The common electrode CE may be disposed on the (2_1)-th capping layer CP2' and the second organic layer VIA2 disposed to overlap the through hole OGH in the third direction DR3. Since the (2_1)-th capping layer CP2' is configured of a transparent conductive material, the common electrode CE and the second connection pattern CNTP may be electrically connected.

Referring to FIGS. 2, 4, and 10A, a third capping layer CP3 disposed on a connection line CNTL and a fourth capping layer CP4 disposed on the pads (for example, the second power pad PDP2) are described.

The pads (for example, the second power pad PDP2) according to an embodiment may include a first metal layer GAT disposed on the gate insulating layer GI, a second metal layer SD1 disposed on the interlayer insulating layer ILD, and a third metal layer SD2 disposed on the first organic layer VIA1. The first metal layer GAT and the second metal layer SD1 configuring the pads (for example, the second power pad PDP2) may be electrically connected through a (3_1)-th contact hole CNT3_1 formed in the interlayer insulating layer ILD, and the second metal layer SD1 and the third metal layer SD2 may be electrically connected through a (3_2)-th contact hole CNT3_2 formed in the first organic layer VIA1. Therefore, the first metal layer GAT, the second metal layer SD1, and the third metal layer SD2 configuring each of the pads (for example, the second power pad PDP2) may be electrically connected to each other.

Each of the pads PDP1, PDP2, and PDD may be electrically connected to the fan-out lines FOL formed of different metal layers. For example, the first power pad PDP1 and the second power pad PDP2 may be electrically connected to the fan-out line FOL formed of the second metal layer SD1, and the data pad PDD may be electrically connected to the fan-out line FOL formed of the first metal layer GAT.

In case that the pads PDP1, PDP2, and PDD have a structure in which the first metal layer GAT1, the second metal layer SD1, and the third metal layer SD2 are sequentially stacked, in preparation for forming a pad by exposing an end of the fan-out line FOL formed of different metal layers to the outside, a contact resistance between the pads PDP1, PDP2, and PDD and a driver IC (not shown) may be reduced, and heights of the pads PDP1, PDP2, and PDD in the third direction DR3 may be the same. Thus, an effect of preventing an occurrence of step difference may be expected.

Since the pads PDP1, PDP2, and PDD have a structure in which the first metal layer GAT1, the second metal layer SD1, and the third metal layer SD2 are sequentially stacked, the third metal layer SD2 may be exposed to the outside. An upper metal layer (for example, the third metal layer SD2) of the pads PDP1, PDP2, and PDD may be multiple layers, similar to the bridge pattern BRP of FIG. 4. For example, the upper metal layer of the pads PDP1, PDP2, and PDD may be a triple metal layer structure of titanium/aluminum/titanium (Ti/Al/Ti). Therefore, in order to prevent reaction between the etchant ET (refer to FIG. 5) for forming the pixel electrode PE and the upper metal layers of the pads PDP1, PDP2, and PDD, the third capping layer CP3 may be disposed on the upper metal layers.

According to an embodiment, the third capping layer CP3 may be disposed on the second organic layer VIA2 and the upper metal layers of the pads PDP1, PDP2, and PDD exposed by a first opening OPN1. The third capping layer CP3 may include a transparent conductive material. The third capping layer CP3 may include any of conductive oxides such as indium tin oxide (ITO), indium zinc oxide (IZO), zinc oxide (ZnO), indium gallium zinc oxide (IGZO), and indium tin zinc oxide (ITZO), and a conductive polymer such as PEDOT (poly(3,4-ethylenedioxythiophene)). However, the third capping layer CP3 is not limited to the above-described example.

The third capping layer CP3 may cover or overlap the upper metal layer (for example, the third metal layer SD2) of the pads PDP1, PDP2, and PDD exposed by the first opening OPN1. Accordingly, the upper metal layer of the pads PDP1, PDP2, and PDD may be prevented from physically contacting the etchant ET (refer to FIG. 5) for forming the pixel electrode PE, and the third capping layer CP3 may not chemically react with the etchant ET (refer to FIG. 5). Thus, the upper metal layers of the pads PDP1, PDP2, and PDD may be prevented from being damaged by the etchant ET (refer to FIG. 5). Since the third capping layer CP3 is configured of a transparent conductive material, an output terminal (not shown) of the driver IC and the upper metal layer of the pads PDP1, PDP2, and PDD may be electrically connected.

The dam portion DAM formed at a lower end of the display area DA may be formed by etching the first organic layer VIA1 and the second organic layer VIA2 on side facing the second power voltage line VSSL and etching the second organic layer VIA2 on another side.

The first power voltage line VDDL may be disposed on the first organic layer VIA1 in parallel with an extension direction (for example, the first direction DR1) of the dam portion DAM. The first power voltage line VDDL may be electrically connected to the fan-out line FOL through the connection line CNTL. A first power voltage supplied from the driver IC (not shown) may be supplied to the first power voltage line VDDL through the second power pad PDP2, the fan-out line FOL, and the connection line CNTL. The connection line CNTL and the first power voltage line VDDL may be integrally formed (or integral with each other). The first power voltage line VDDL may be disposed in the non-display area NDA to provide the first power voltage of the same potential to each of the pixels PXL.

The connection line CNTL and the bridge pattern BRP of FIG. 4 may be formed of the same material and may be formed simultaneously. The connection line CNTL may be disposed on the fan-out line FOL. The connection line CNTL may include a metal. The connection line CNTL may be multiple layers. For example, the connection line CNTL may be a triple metal film structure of titanium/aluminum/titanium (Ti/Al/Ti).

Therefore, similar to the bridge pattern BRP, the fourth capping layer CP4 may be disposed on the connection line CNTL to prevent reaction between the etchant ET (refer to FIG. 5) for forming the pixel electrode PE and the connection line CNTL. According to an embodiment, the fourth capping layer CP4 may be disposed on the second organic layer VIA2 and the connection line CNTL exposed by a second opening OPN2.

The fourth capping layer CP4 may include a transparent conductive material. The fourth capping layer CP4 may include any of conductive oxides such as indium tin oxide (ITO), indium zinc oxide (IZO), zinc oxide (ZnO), indium gallium zinc oxide (IGZO), and indium tin zinc oxide (ITZO), and a conductive polymer such as PEDOT (poly(3,4-ethylenedioxythiophene)). However, the fourth capping layer CP4 is not limited to the above-described example.

The fourth capping layer CP4 may be disposed on the connection line CNTL and the second organic layer VIA2. The fourth capping layer CP4 may cover the connection line CNTL exposed to the outside. Accordingly, the connection line CNTL may be prevented from physically contacting the etchant ET (refer to FIG. 5) for forming the pixel electrode PE, and the fourth capping layer CP4 may not chemically react with the etchant ET (refer to FIG. 5). Thus, the connection pattern CNTP may be prevented from being damaged by the etchant ET.

Referring to FIGS. 10A and 10B, the embodiment shown in FIG. 10B is different from the embodiment shown in FIG. 10A, in which the upper metal layer (for example, the third metal layer SD2), the second organic layer VIA2, and the third capping layer CP3 are sequentially stacked, and the connection line CNTL, the second organic layer VIA2, and the fourth capping layer CP4 are sequentially stacked, in that the upper metal layer (for example, the third metal layer SD2), a (3_1)-th capping layer CP3', and the second organic layer VIA2 are sequentially stacked, and the connection line CNTL, a (4_1)-th capping layer CP4', and the second organic layer VIA2 are sequentially stacked. Since other configurations are substantially the same as those of the embodiment shown in FIG. 10A, a repetitive description thereof is omitted.

Specifically, the upper metal layer (for example, the third metal layer SD2) of the pads PDP1, PDP2, and PDD and the connection line CNTL may be multiple layers. For example, the upper metal layer (for example, the third metal layer SD2) of the pads PDP1, PDP2, and PDD and the connection line CNTL may be a triple metal layer structure of titanium/aluminum/titanium (Ti/Al/Ti). The (3_1)-th capping layer CP3' and the (4_1)-th capping layer CP4' may be directly disposed on the entire upper surface of each of the upper metal layer (for example, the third metal layer SD2) of the pads PDP1, PDP2, and PDD and the connection line CNTL. In other words, the (3_1)-th capping layer CP3' may be disposed on the upper metal layer (for example, the third metal layer SD2) of the pads PDP1, PDP2, and PDD exposed by the first opening OPN1 formed in the second organic layer VIA2 and may be disposed to cover the entire upper surface of the upper metal layer (for example, the third metal layer SD2) of the pads PDP1, PDP2, and PDD. The (4_1)-th capping layer CP4' may be disposed on the connection line CNTL exposed to the outside and may be disposed to cover the entire upper surface of the connection line CNTL.

Accordingly, the upper metal layer (for example, the third metal layer SD2) of the pads PDP1, PDP2, and PDD and the connection line CNTL may not be exposed to the etchant ET (refer to FIG. 5) for forming the pixel electrode PE. In this case, the pixel electrode PE may be multiple layers including copper (Cu) and titanium (Ti), such as a Cu/Ti double layer.

Since the (3_1)-th capping layer CP3' is configured of a transparent conductive material, the output terminal (not shown) of the driver IC and the upper metal layer of the pads PDP1, PDP2, and PDD may be electrically connected.

Figure 11:
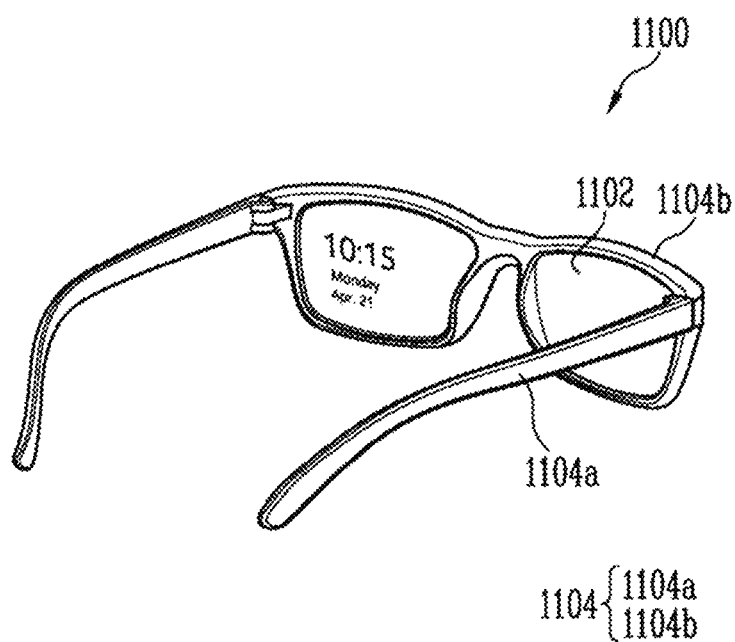
FIGS. 11 to 14 are diagrams illustrating an example to which a display device according to an embodiment is applied.
Figure 12:
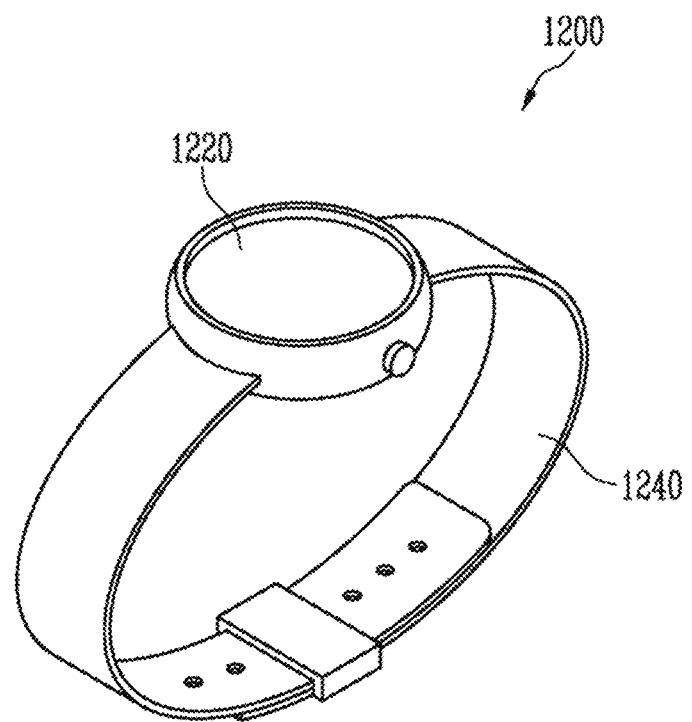
Figure 13:
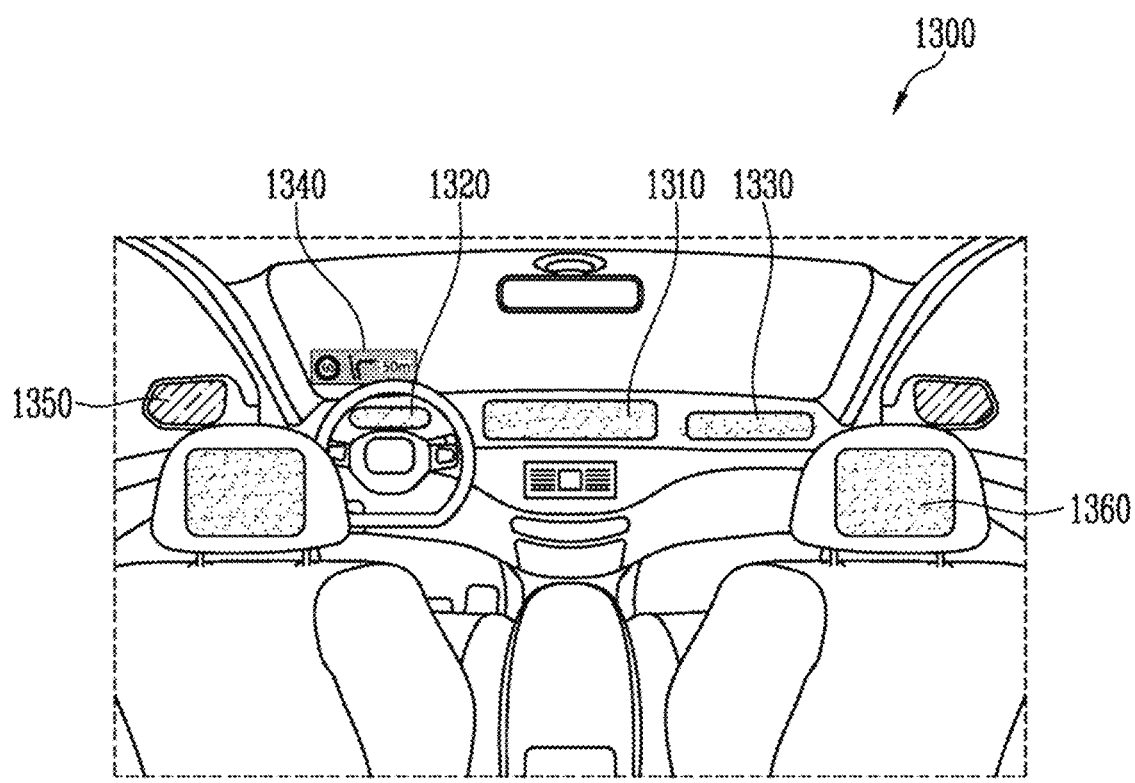

Hereinafter, an application field of the display device DD according to an embodiment is described with reference to FIGS. 11 to 13. FIGS. 11 to 14 are schematic diagrams illustrating an example to which a display device according to an embodiment is applied. According to an example, the display device DD may be applied to a smartphone, a notebook computer, a tablet PC, a television, and the like, and may be applied to various other embodiments.

Referring to FIGS. 1 and 11, a display device DD according to an embodiment may be applied to a smart glass 1100 including a frame 1104 and a lens portion 1102. The smart glass 1100 may be a wearable electronic device that may be worn on a face of a user, and may be a structure in which a portion of the frame 1104 is folded or unfolded. For example, the smart glass 1100 may be a wearable device for augmented reality (AR).

The frame 1104 may include a housing 1104b supporting the lens portion 1102 and a leg portion 1104a for wearing of the user. The leg portion 1104a may be electrically connected to the housing 1104b by a hinge and may be folded or unfolded.

The frame 1104 may include a battery, a touch pad, a microphone, a camera, and the like therein. The frame 1104 may include a projector that outputs light, a processor that controls a light signal, etc., and the like therein.

The lens portion 1102 may be an optical member that transmits or reflects light. The lens portion 1102 may include glass, transparent synthetic resin, or the like.

The lens portion 1102 may reflect an image by a light signal transmitted from the projector of the frame 1104 by a rear surface (for example, a surface in a direction facing an eye of the user) of the lens portion 1102 to allow the eye of the user to recognize the image. For example, as shown in the drawing, the user may recognize information such as time and date displayed on the lens portion 1102. For example, the lens portion 1102 may be a type of a display device, and the display device DD according to the above-described embodiment may be applied to the lens portion 1102.

Referring to FIG. 12, a display device DD according to an embodiment may be applied to a smartwatch 1200 including a display portion 1220 and a strap portion 1240.

The smartwatch 1200 may be a wearable electronic device and may have a structure in which the strap portion 1240 is mounted on a wrist of a user. The display device DD according to an embodiment may be applied to the display portion 1220, and thus image data including time information may be provided to the user.

Referring to FIG. 13, a display device DD according to an embodiment may be applied to an automotive display 1300. The automotive display 1300 may refer to an electronic device provided inside and outside a vehicle to provide image data.

According to an embodiment, the display device DD may be applied to at least one of an infotainment panel 1310, a cluster 1320, a co-driver display 1330, a head-up display 1340, a side-view mirror display 1350, and a rear seat display 1360, which are provided in the vehicle.

Figure 14:
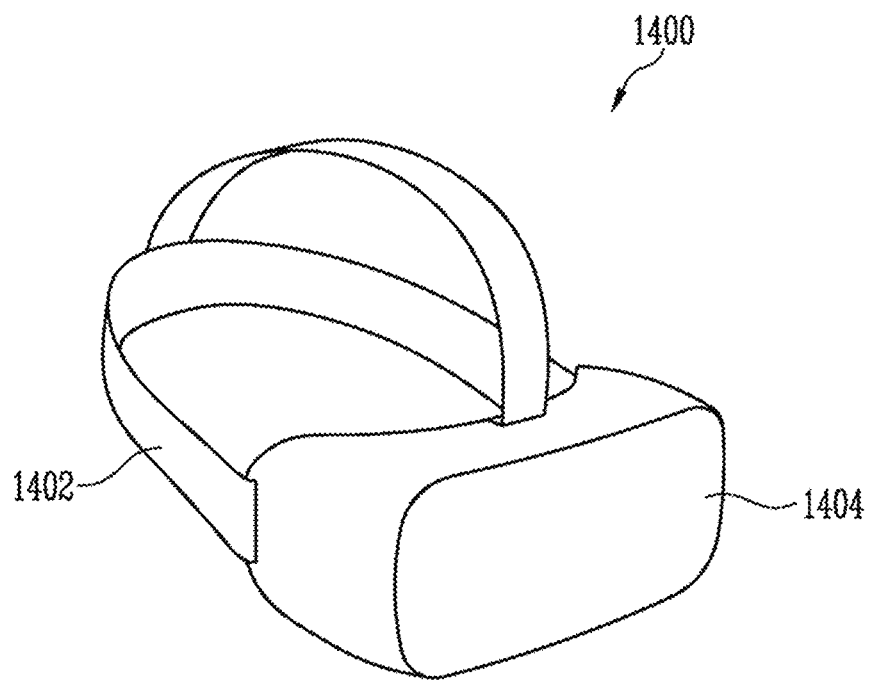

Referring to FIG. 14, a display device DD according to an embodiment may be applied to a head-mounted display (HMD) 1400 including a head-mounted band 1402 and a display storage case 1404. The HMD is a wearable electronic device that may be worn on a head of a user.

The head-mounted band 1402 is a portion connected to the display storage case 1404 and fixing the display storage case 1404. FIG. 14 illustrates that the head-mounted band 1402 is shown to be able to surround an upper surface and both side surfaces of the head of the user, but the disclosure is not limited thereto. The head-mounted band 1402 may be provided for fixing the HMD to the head of the user, and may be formed in an eyeglass frame form or a helmet form.

The display storage case 1404 may accommodate the display device DD and may include at least one lens. The at least one lens is a portion that provides an image to the user. For example, the display device DD according to an embodiment may be applied to a left-eye lens and a right-eye lens implemented in the display storage case 1404.

The application field of the display device DD according to an embodiment is not limited to the above-described example, and may be applied to various fields according to an embodiment.

The above description is merely an example of the technical spirit of the disclosure, and those skilled in the art to which the disclosure pertains will be able to make various modifications and variations without departing from the essential characteristics of the disclosure. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a substrate including a display area and a non-display area;
   a pixel circuit portion disposed on the substrate and including both a bridge pattern and a transistor that drives a pixel overlapping the display area, the transistor including a gate electrode and at least one other electrode; and a display element portion disposed on the pixel circuit portion and including a pixel electrode of the pixel, the pixel electrode being electrically connected to the at least one other electrode of the transistor through at least the bridge pattern, wherein the pixel circuit portion includes a first capping layer disposed between and electrically connecting the bridge pattern and the pixel electrode, the pixel electrode includes multiple metal layers, the bridge pattern includes multiple metal layers, at least one of the multiple metal layers of the pixel electrode includes a same material as at least one of the multiple metal layers of the bridge pattern, and the first capping layer includes a material different from materials of the multiple metal layers of the pixel electrode and a layer among the multiple metal layers of the bridge pattern that is closest to the pixel electrode.

2. The display device according to claim 1, wherein the multiple metal layers of the pixel electrode include:
 a first layer including copper; and
 a second layer including titanium and disposed on the first layer, and the multiple metal layers of the bridge pattern include:
 a third layer including aluminum;
 the layer including titanium; and
 a fourth layer including titanium, the third layer being disposed between the layer and the fourth layer.

3. The display device according to claim 1, wherein the first capping layer is formed of a transparent, electrically conductive material.

4. The display device according to claim 1, further comprising:

an organic layer disposed between the bridge pattern and the pixel electrode, the organic layer including a first contact hole exposing a surface of the bridge pattern, wherein the first capping layer is disposed on both the surface of the bridge pattern exposed by the first contact hole and a surface of the organic layer facing the pixel electrode.

5. The display device according to claim 1, wherein the first capping layer is disposed on an entire upper surface of the bridge pattern facing the pixel electrode.

6. The display device according to claim 1, wherein the pixel includes a light emitting element disposed on a surface of the pixel electrode, the light emitting element having an aspect ratio greater than 1.

7. The display device according to claim 6, further comprising:

a light control portion disposed on the display element portion and changing a wavelength of light provided from the light emitting element, the light emitting element being disposed between the light control portion and the pixel electrode.

8. The display device according to claim 6, further comprising:

a first power voltage line disposed on the substrate;

a second power voltage line disposed on the substrate; and a common electrode overlapping both the light emitting element and the pixel electrode, wherein the light emitting element includes:
 a first distal end portion electrically connected to the first power voltage line through at least the pixel electrode; and
 a second distal end portion electrically connected to the second power voltage line through at least the common electrode, the second distal end portion opposing the first distal end portion.

9. The display device according to claim 8, further comprising:

a connection pattern overlapping the non-display area, wherein the pixel circuit portion includes the second power voltage line, which overlaps the non-display area, and the second power voltage line is electrically connected to the common electrode through at least the connection pattern.

10. The display device according to claim 9, wherein the pixel circuit portion includes:

a second capping layer disposed between and electrically connecting the connection pattern and the common electrode.

11. The display device according to claim 10, further comprising:

an organic layer disposed between the bridge pattern and the pixel electrode, the organic layer including:
 a first contact hole exposing a surface of the bridge pattern; and
 a second contact hole exposing a surface of the connection pattern, wherein the first capping layer is at least partially disposed in the first contact hole, and the second capping layer is disposed on both the surface of the connection pattern exposed by the second contact hole and a surface of the organic layer adjacent to the second contact hole.

12. The display device according to claim 11, wherein the connection pattern includes through holes, and the through holes do not overlap the second contact hole in a view in a direction perpendicular to the surface of the connection pattern.

13. The display device according to claim 10, wherein the second capping layer is disposed on an entire upper surface of the connection pattern facing the common electrode.

14. The display device according to claim 10, wherein the second capping layer is formed of a transparent, electrically conductive material, and the connection pattern includes:
 a first layer including aluminum; and
 two second layers including titanium, the first layer being disposed between the two second layers.

15. The display device according to claim 9, wherein the pixel circuit portion includes a pad area, and the pad area include pads disposed on a surface of the non-display area.

16. The display device according to claim 15, wherein each of the pads includes multiple metal layers overlapping one another in a direction perpendicular to the surface of the non-display area, the multiple metal layers being electrically connected to one another, each of the multiple metal layers includes:
 a first metal layer furthest from the surface of the non-display area among the multiple metal layers; and
 a second metal layer disposed between the first metal layer and the substrate, and each of the first metal layers includes:
 a first layer including aluminum; and
 two second layers including titanium, the first layer being disposed between the two second layers.

17. The display device according to claim 16, further comprising:
    an organic layer disposed between the bridge pattern and the pixel electrode,
    wherein the organic layer includes:
        a first contact hole exposing a surface of the bridge pattern, the first capping layer being at least partially disposed in the first contact hole; and
        first openings exposing corresponding surfaces of the first metal layers of the pads, each of the corresponding surfaces opposing respective other surfaces of the first metal layers, the respective other surfaces facing the surface of the non-display area.

18. The display device according to claim 17, further comprising:
    third capping layers respectively disposed on the corresponding surfaces of the first metal layers respectively exposed by the first openings and corresponding portions of the organic layer.

19. The display device according to claim 18, wherein each of the third capping layers is formed of a transparent, electrically conductive material.

20. The display device according to claim 18, further comprising:
    a fan-out line electrically connected to a pad among the pads; and
    a connection line electrically connected to the fan-out line,
    wherein the first power voltage line is electrically connected to the fan-out line at least through the connection line.

21. The display device according to claim 20, further comprising:
    a fourth capping layer, wherein
    the organic layer further includes a second opening exposing a surface of the connection line, and
    the fourth capping layer is disposed on both the surface of the connection line and the organic layer.

22. The display device according to claim 21, wherein the fourth capping layer is formed of a transparent, electrically conductive material.

* * * * *